(12) United States Patent
Imai et al.

(10) Patent No.: US 11,876,127 B2
(45) Date of Patent: Jan. 16, 2024

(54) SEMICONDUCTOR DEVICE AND METHOD OF MANUFACTURING THE SAME

(71) Applicant: RENESAS ELECTRONICS CORPORATION, Tokyo (JP)

(72) Inventors: Tomohiro Imai, Tokyo (JP); Yoshito Nakazawa, Tokyo (JP); Katsumi Eikyu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 262 days.

(21) Appl. No.: 17/405,648

(22) Filed: Aug. 18, 2021

(65) Prior Publication Data

US 2022/0069111 A1 Mar. 3, 2022

(30) Foreign Application Priority Data

Sep. 3, 2020 (JP) .................................. 2020-148586

(51) Int. Cl.
*H01L 29/739* (2006.01)
*H01L 29/66* (2006.01)
*H01L 29/06* (2006.01)

(52) U.S. Cl.
CPC ...... *H01L 29/7397* (2013.01); *H01L 29/0607* (2013.01); *H01L 29/66348* (2013.01)

(58) Field of Classification Search
CPC ............. H01L 29/7397; H01L 29/0607; H01L 29/66348
USPC ........................................................ 257/139
See application file for complete search history.

(56) References Cited

U.S. PATENT DOCUMENTS

| 9,842,919 | B2 | 12/2017 | Matsuura | |
|---|---|---|---|---|
| 2006/0292805 | A1* | 12/2006 | Kawamura | ......... H01L 29/7397 257/E29.198 |
| 2016/0197143 | A1* | 7/2016 | Naito | ................ H01L 29/66348 257/334 |
| 2017/0018635 | A1 | 1/2017 | Tsuyuki | |
| 2017/0033206 | A1 | 2/2017 | Matsuura | |
| 2019/0109131 | A1* | 4/2019 | Naito | .................. H01L 29/7397 |
| 2019/0244812 | A1 | 8/2019 | Nishio et al. | |

FOREIGN PATENT DOCUMENTS

| CN | 10552121 A | 5/2016 |
|---|---|---|
| JP | H01-231372 A | 9/1989 |
| JP | 2000-058819 A | 2/2000 |
| JP | 2004-039893 A | 2/2004 |
| JP | 2011-066341 A | 3/2011 |

(Continued)

OTHER PUBLICATIONS

Notice of reasons for refusal received in Japanese Patent Application No. 2020-148586, dated Nov. 14, 2023.

*Primary Examiner* — Igwe U Anya
(74) *Attorney, Agent, or Firm* — McDermott Will & Emery LLP

(57) ABSTRACT

An IGBT capable of handling high-speed switching while reducing a leakage current of a semiconductor device including the IGBT is provided. The semiconductor device according to one embodiment includes an IGBT including a p-type collector layer on a back surface of a silicon substrate and a dislocation suppressing layer for forming a hetero junction with silicon in the p-type collector layer. The dislocation suppressing layer includes a silicon germanium (SiGe) layer.

20 Claims, 24 Drawing Sheets

(56) References Cited

FOREIGN PATENT DOCUMENTS

| JP | 2017-022311 A | 1/2017 |
| JP | 2017-034040 A | 2/2017 |
| JP | 2017-157733 A | 9/2017 |
| JP | 2019-140186 A | 8/2019 |

* cited by examiner

FIG. 7
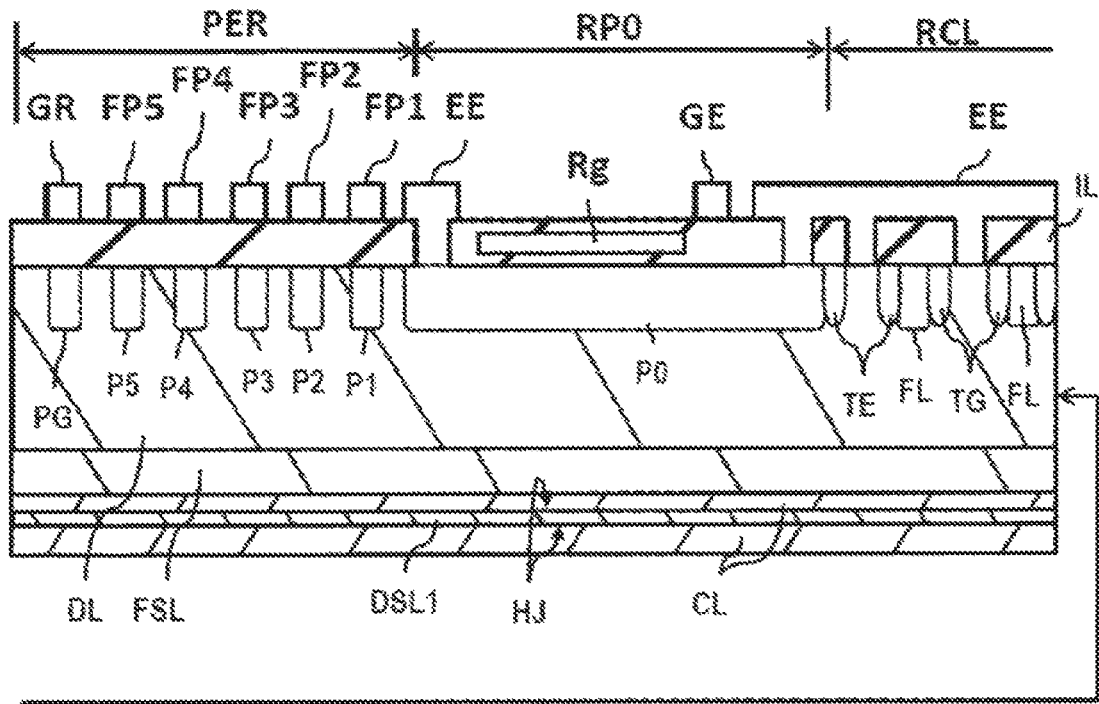
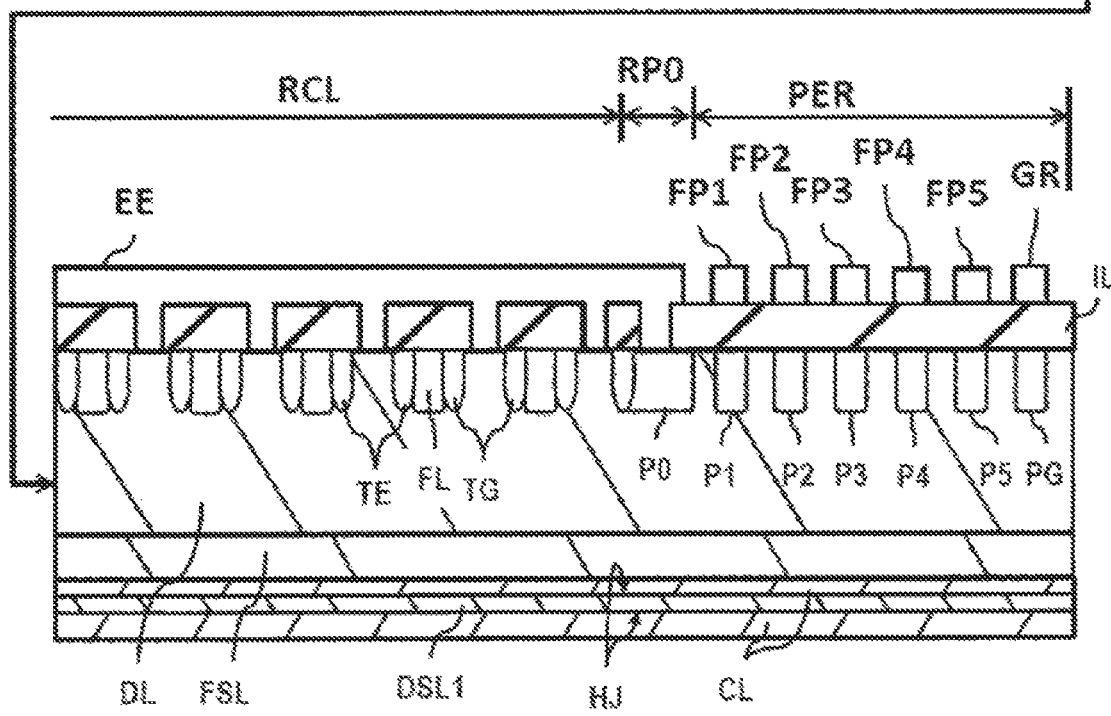

|  | Ref.(Si) | SiGe PATTERN 1 | SiGe PATTERN 2 |
|---|---|---|---|
| Eon[mJ] | 12.27 | 12.29 | 10.25 |
| Eoff[mJ] | 15.36 | 15.04 | 15.22 |

SEMICONDUCTOR DEVICE AND METHOD OF MANUFACTURING THE SAME

CROSS-REFERENCE TO RELATED APPLICATION

The disclosure of Japanese Patent Application No. 2020-148586 filed on Sep. 3, 2020, including the specification, drawings and abstract is incorporated herein by reference in its entirety.

BACKGROUND

The present invention relates to a semiconductor device and a method of manufacturing it, and, more particularly relates to a technique effectively applied to a semiconductor device having an IE (Injection Enhanced)-type IGBT (Insulated Gate Bipolar Transistor) and a method of manufacturing it.

There are disclosed techniques listed below.
[Patent Document 1] Japanese Unexamined Patent Application Publication No. 2017-157733

One structure example of the IE-type IGBT has been known, the structure including a stripe-patterned trench gate that is formed so as to surround an n-type emitter layer and a p-type base layer in a planar view, a p-type floating layer that is arranged outside the trench gate and having one end in contact with a side surface of the trench gate, and an n-type hole barrier layer that is formed below the p-type base layer (see, for example, the Patent Document 1).

The Patent Document 1 also discloses a structure including a stripe-patterned trench emitter that is in contact with the other end of the p-type floating layer for the purpose of providing a path for discharging positive holes accumulated in the p-type floating layer in order to suppress switching loss of the IGBT. Further, the Patent Document 1 discloses a structure including a p-type collector layer and an n-type field stop layer in a lower surface of an n-type drift layer arranged below the p-type base layer.

SUMMARY

In a viewpoint of reduction in a leakage current at the time of high-speed switching of the IGBT or reduction in a leakage current at the time of reverse bias, the present inventors have found out the following concerns about the n-type field stop layer and the p-type collector layer on a back surface of the IGBT.

As shown in FIG. 1A, in order to form the n-type field stop layer and the p-type collector layer of the IGBT in a back surface BS of a substrate SUB made of an n-type single crystal silicon, for example, phosphorus (P) that is an n-type impurity and a boron (B) that is a p-type impurity are sequentially ion-implanted into the back surface BS of the silicon substrate to form an n-type impurity implanted layer NI and a p-type impurity implanted layer PI. Then, the back surface of the substrate SUB is subjected to laser annealing LA to activate the impurity implanted layers NI and PI, so that an n-type field stop layer FSL and a p-type collector layer CL are formed as shown in FIG. 1B.

At the time of the laser emission in the laser annealing LA, about 0.2 μm thickness of silicon on the outermost surface of the back surface BS of the substrate SUB is melted once to form a melting layer ML. After the laser emission, a temperature of the substrate SUB decreases, and the melting layer ML is recrystallized. The present inventors have found out that existence of particles PTL on a surface of the melting layer ML in the recrystallization causes dislocation defect DIL starting from the particles PTL as a start point in the back surface BS of the substrate SUB as shown in FIG. 1C.

Extension of this dislocation defect DIL to the n-type field stop layer FSL causes concerns of leakage failure between the collector and the emitter of the IGBT and reverse-bias leakage failure. If the particles PTL can be completely eliminated in a process of forming the back surface structure of the IGBT, the problem of the dislocation defect can be solved. However, the IGBT particularly handling the high voltage and the high electric current has a larger chip area (for example, equal to or larger than 10 mm$^2$) than that of a regular LSI chip, and therefore, it is practically very difficult to completely eliminate the particles PTL.

And, in order to reduce an ON resistance in the IGBT, the back surface of then-type silicon substrate to be adrift layer is thinned by grinding and polishing. Therefore, the n-type field stop layer and the p-type collector layer to be formed on the back surface of the substrate are formed on the thinned back surface of the substrate after the sequential formation of the n-type emitter layer, the p-type base layer, the p-type floating layer, the n-type hole barrier layer and others on a main surface of the substrate. In order to maintain impurity profiles of the n-type emitter layer, the p-type base layer and others, a heating process of a high temperature for forming the n-type field stop layer and the p-type collector layer is limited so as to be performed to the entire substrate. Therefore, in the manufacture of the IGBT, the laser annealing capable of partially performing the heating process to the substrate has been an effective technique in recent years.

Other objects and novel characteristics will be apparent from the description of the present specification and the accompanying drawings.

A semiconductor device according to one embodiment includes an IGBT including a p-type collector layer on a back surface of a silicon substrate, and includes a dislocation suppressing layer forming a hetero junction with silicon in the p-type collector layer. The dislocation suppressing layer includes a silicon germanium (SiGe) layer.

By the semiconductor device according to one embodiment, the leakage current of the semiconductor device including the IGBT can be reduced, and the IGBT capable of handling the high-speed switching can be provided.

BRIEF DESCRIPTIONS OF THE DRAWINGS

FIG. 7 is a schematic cross-sectional view taken along a line A-A of FIG. 5.

DETAILED DESCRIPTION

A semiconductor device according to one embodiment will be described in detail below with reference to the accompanying drawings. In the specification and the drawings, note that the same elements or the corresponding elements are denoted with the same reference symbols, and the repetitive description thereof will be omitted. In addition, at least some of each of embodiments and modification examples may be optionally combined with one another.

Figure 2:
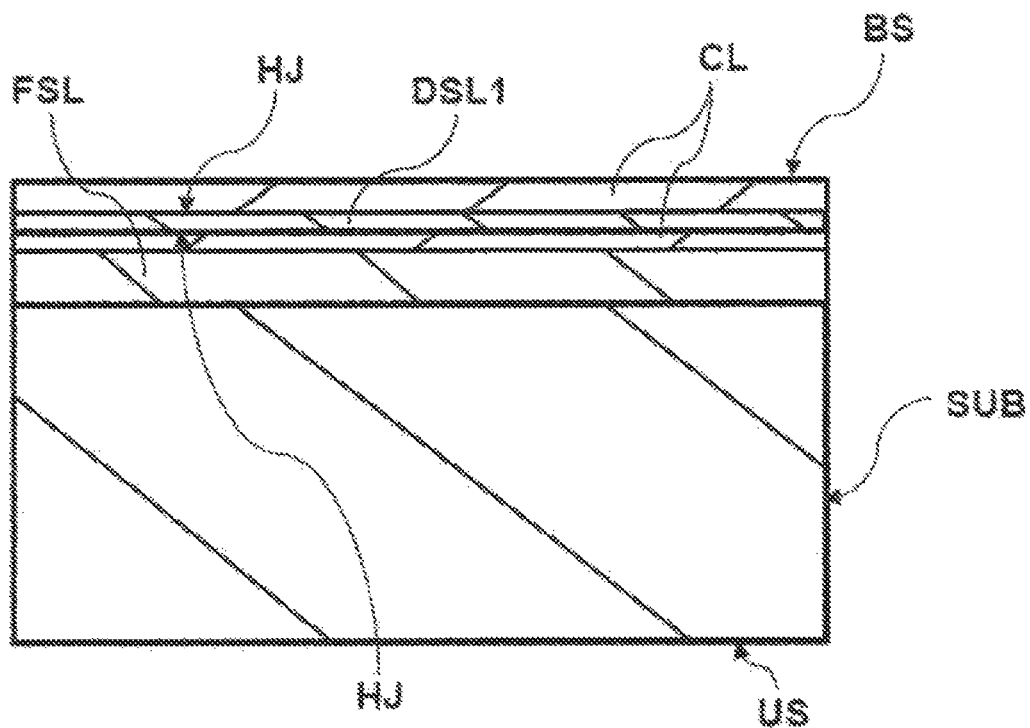
FIG. 2 is a cross-sectional view of a principal part showing a structure of the region of the back surface of the semiconductor device including the IGBT according to one embodiment.

With reference to FIG. 2, the structure of the region of the back surface of the IGBT will be explained. FIG. 2 is a cross-sectional view of a principal part showing the structure of the region of the back surface of the semiconductor device including the IGBT according to one embodiment. The explanation will be made so as to omit the n-type emitter layer, the p-type base layer, the trench gate, the trench emitter, the p-type floating layer, the n-type hole barrier layer and others to be formed in a region of a front surface US of the substrate SUB. The front surface US of the substrate SUB can be regarded as a first main surface, and the back surface BS of the substrate SUB can be regarded as a second main surface facing the first main surface.

Figure 1A:
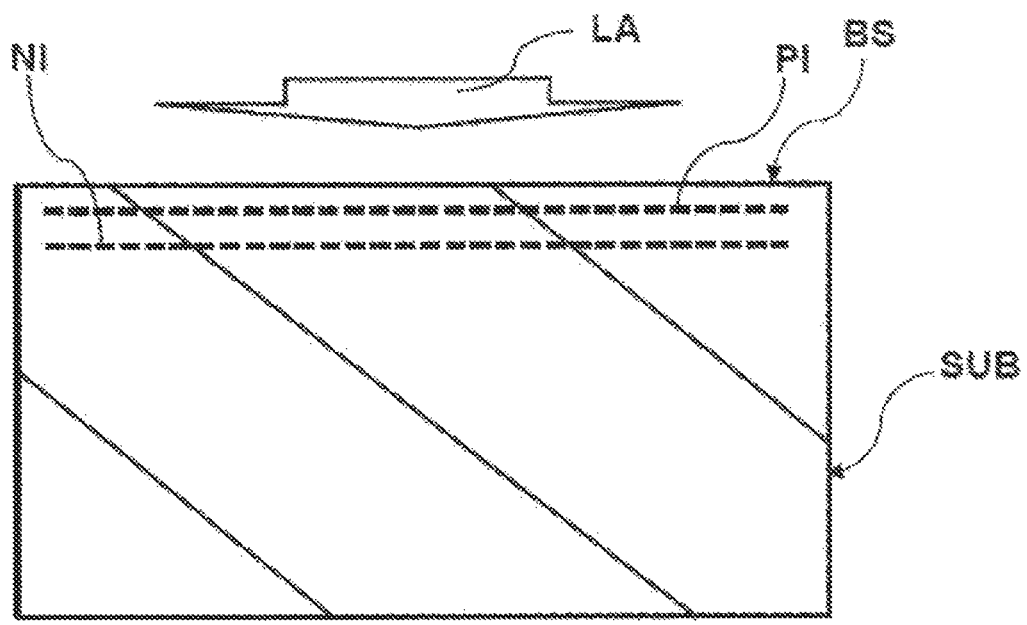
FIG. 1A is a cross-sectional view of a principal part for explaining a method of manufacturing a region of a back surface of a semiconductor device including an IGBT studied by the present inventors.
Figure 1B:
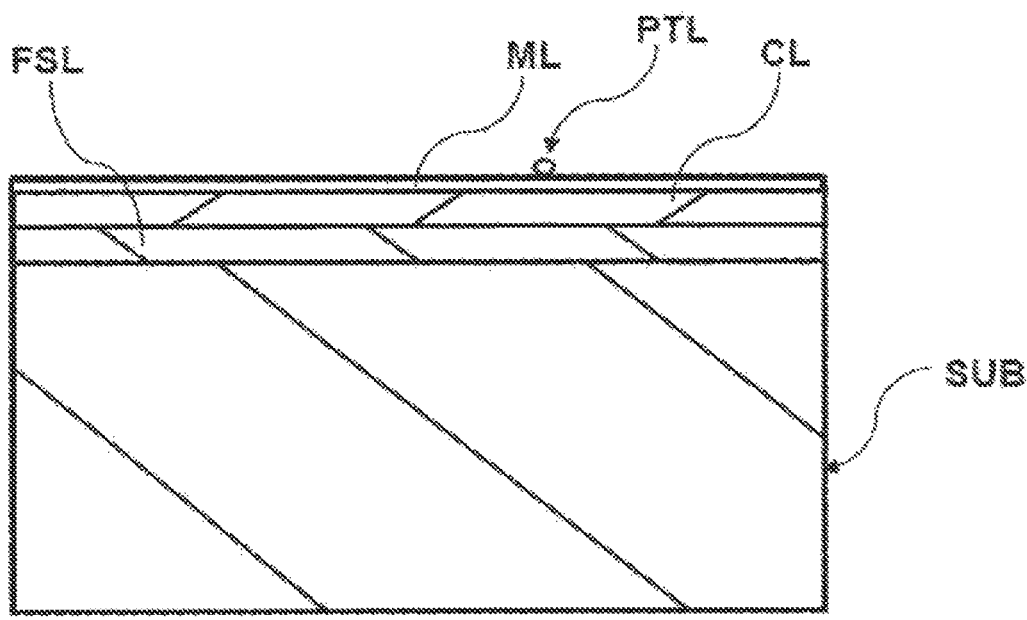
FIG. 1B is a cross-sectional view of a principal part for explaining the method of manufacturing the same, continued from FIG. 1A.

As shown in FIG. 2, the field stop layer FSL made of the n-type semiconductor layer and the collector layer CL made of the p-type semiconductor layer are formed on the back surface BS of the substrate SUB made of the r-type silicon. Inside the collector layer CL, the dislocation suppressing layer DSL1 made of silicon germanium (SiGe) is formed. The dislocation suppressing layer DSL1 is formed so as to provide a hetero junction HJ made of the silicon layer and the silicon germanium (SiGe) layer in the collector layer CL. By this hetero junction HJ, the dislocation defect DIL can be suppressed from extending toward the field stop layer FSL even when the particles PTL shown in FIG. 1B exist on the back surface BS of the substrate SUB, and therefore, the electric current leakage between the emitter and the collector and the electric current leakage at the time of the reverse bias can be suppressed.

The dislocation suppressing layer DSL1 is arranged at a position that is 0.2 µm deep or more from the outermost surface of the back surface BS of the substrate SUB. This is for avoiding influence of the melting layer ML since about 0.2 µm thickness of the silicon on the outermost surface of the back surface BS of the substrate SUB is melted once to form the melting layer ML. As described above, when the dislocation suppressing layer DSL1 is arranged at the relatively deep position of the collector layer CL, the hetero junction HJ can be formed on both upper and lower surfaces of the dislocation suppressing layer DSL1, and therefore, an effect of suppressing the dislocation defect DIL is high.

Figure 3:
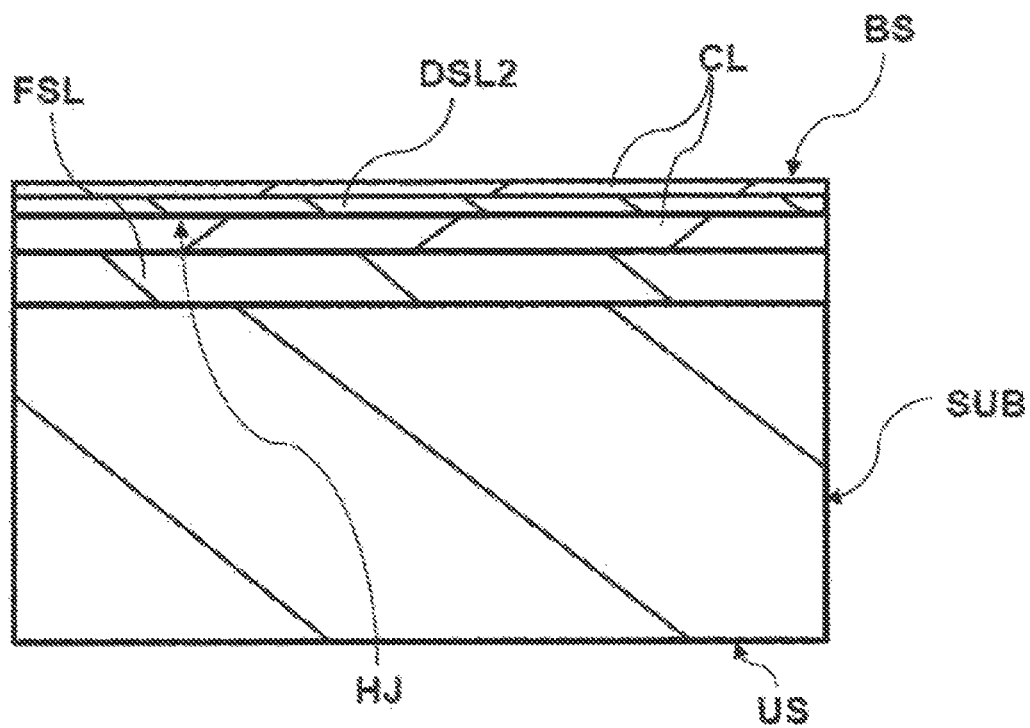
FIG. 3 is a cross-sectional view of a principal part showing another structure of the region of the back surface of the semiconductor device including the IGBT according to one embodiment.

Alternatively, as shown in FIG. 3, the position of the dislocation suppressing layer may be arranged near the back surface BS of the substrate SUB. In this case, the hetero junction is not formed in a side of the dislocation suppressing layer DSL2, the side being closer to the back surface BS, because the side overlaps the melting layer ML. However, since the impurity profile of the dislocation suppressing layer DSL2 can be set to be sharper than that of the dislocation suppressing layer DSL1 shown in FIG. 2, the output property of the IGBT can be improved.

The dislocation suppressing layer is formed by ion implantation with germanium (Ge) from the region of the back surface BS of the substrate SUB, and the dislocation suppressing layer DSL2 shown in FIG. 3 can be formed by ion implantation of a low acceleration energy (in a range of, for example, 150 to 500 keV) because of being formed at a shallow position from the back surface BS. Therefore, the dislocation suppressing layer DSL2 can be formed to be thin, and thus, the output property of the IGBT can be improved.

On the other hand, the dislocation suppressing layer DSL1 shown in FIG. 2 is formed by ion implantation of a higher acceleration energy (in a range of, for example, 600 to 900 keV) than that of the dislocation suppressing layer DSL2, and therefore, ion scattering becomes large, the impurity profile is broadened, and the output property of the IGBT decreases. However, the hetero junction can be formed on two surfaces inside the collector layer CL, and therefore, the effect of suppressing the leakage current is high. In other words, there is a bandgap difference between silicon germanium (SiGe) and silicon (Si), and this bandgap difference blocks hole doping from the region of the back surface. The broadening of the impurity profile of the ion-implanted germanium (Ge) is equivalent to spread of a region having the uneven bandgap, and therefore, enhances an effect of blocking the hole doping. Therefore, the output property of the IGBT is reduced.

Figure 4:
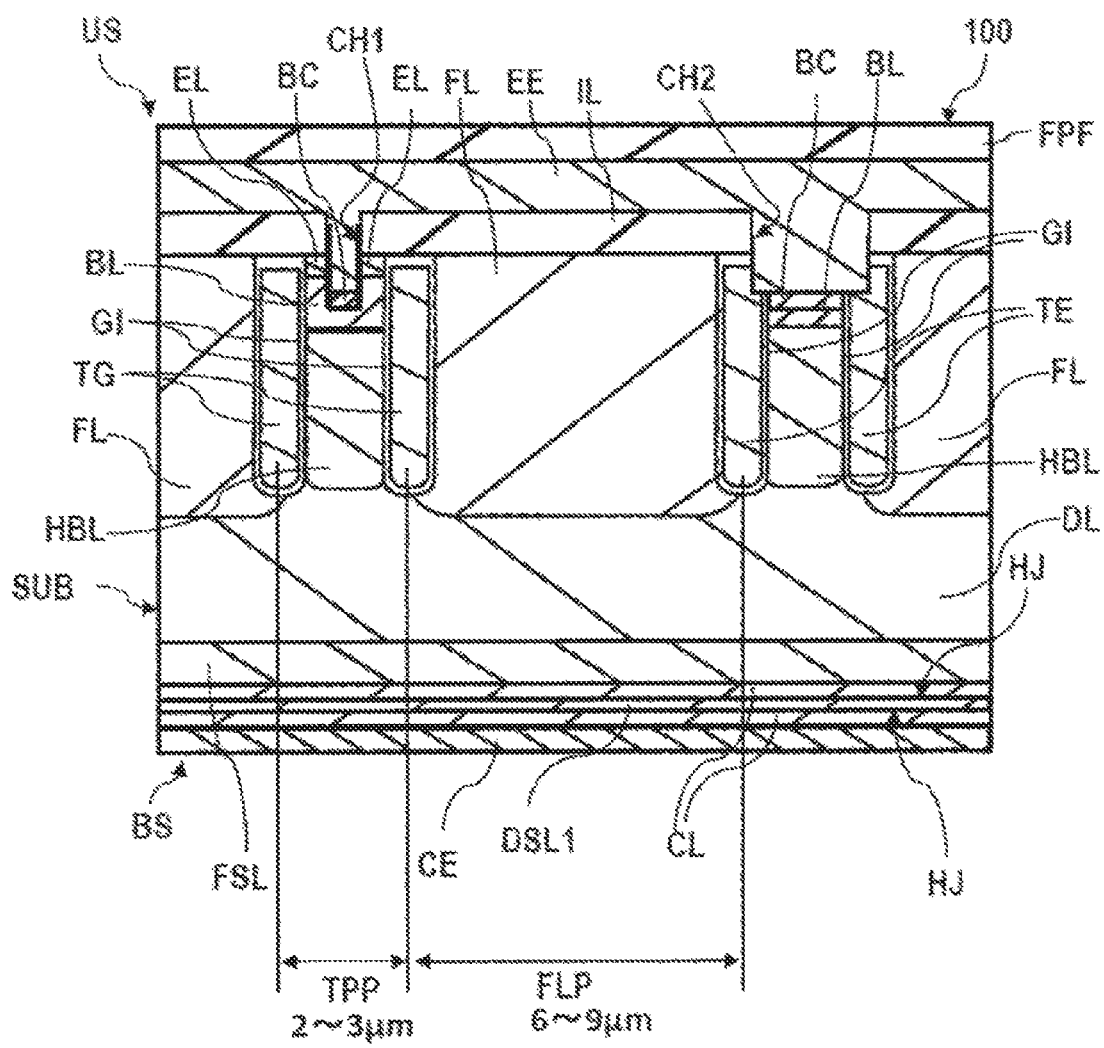
FIG. 4 is a cross-sectional view of a principal part for explaining a cell structure of the semiconductor device including the IGBT according to one embodiment.

FIG. 4 shows one example of the IE-type IGBT including the dislocation suppressing layer DSL1 explained with reference to FIG. 2. As shown in FIG. 4, the IE-type IGBT 100 includes a trench gate TG, a trench emitter TE, a p-type base layer BL, an n-type emitter layer EL, a p-type floating layer FL and an n-type hole barrier layer HBL that are formed in the region of the main surface of the substrate SUB made of the n-type silicon. The IE-type IGBT 100 also includes an n-type drift layer DL below the n-type hole barrier layer HBL, an n-type field stop layer FSL below the n-type drift layer DL, a p-type collector layer CL below the n-type field stop layer FSL, and a collector electrode CE below the p-type collector layer CL. In the collector layer CL, the dislocation suppressing layer DSL1 made of the silicon germanium (SiGe) layer is formed. To the p-type base layer BL and the n-type emitter layer EL, an emitter electrode EE is electrically connected through a connection hole CH1 formed in an interlayer insulating film IL. Note that a term "BC" indicates a p-type base contact layer of a high concentration formed in a surface of the p-type base layer BL. The emitter electrode EE is electrically connected to the trench emitter TE and the p-type base layer BL between the trench emitters TE through a connection hole CH2 formed in the interlayer insulating film IL. An insulating film FPF is formed on an upper side of the emitter electrode EE. The insulating film FPF is a final passivation film made of an organic insulating film containing, for example, polyimide as a main component.

The IE-type IGBT 100 includes a parasitic P-channel-type MOSFET, a source region of which is the p-type floating layer FL, a drain region of which is the p-type base layer BL, and a gate electrode of which is the trench emitter TE. The n-type hole barrier layer HBL configures a channel formation region of the parasitic P-channel-type MOSFET. By the parasitic P-channel-type MOSFET, the holes accumulated in the p-type floating layer FL at the time of turning OFF of the IGBT are discharged to the emitter electrode EE through a short path, so that the switching time can be shortened. Besides, potential shift of the p-type floating layer FL is suppressed, and therefore, a potential of the trench gate TG is stabled, and the switching loss can be suppressed. In addition to these effects, the electric current leakage between the emitter and the collector and the electric current leakage at the time of the reverse bias can be suppressed since the IE-type IGBT 100 includes the dislocation suppressing layer DSL1.

Materials and shapes of the semiconductor layer, the insulating film and the electrode configuring the IE-type IGBT 100 will be briefly explained below.

First, the substrate SUB is made of single crystal silicon doped with an n-type impurity such as phosphorus (P), and has an impurity concentration of, for example, about $2 \times 10^{14}$ $cm^{-3}$. This concentration is an impurity concentration of the drift layer DL. A thickness of the substrate SUB is, for example, about 450 μm to 1000 μm.

The n-type hole barrier layer HBL is formed by doping with an n-type impurity from the region of the front surface US of the substrate SUB. As this doping with the n-type impurity, ion implantation using phosphorus as ion species, having a dose amount of about $6 \times 10^{12}$ $cm^{-2}$ and an implantation energy of about 200 keV can be preferably exemplified. The n-type hole barrier layer HBL suppresses the positive holes from reaching the p-type base layer BL and being discharged at the time of the operation of the IE-type IGBT 100, and functions as a barrier for the positive holes. An impurity concentration of the n-type hole barrier layer HBL is set to be higher than an n-type impurity concentration of the n-type drift layer DL but lower than an n-type impurity concentration of the n-type emitter layer EL described later.

The p-type floating layer FL is formed by doping with a p-type impurity from the region of the front surface US of the substrate SUB. As this doping with the p-type impurity, ion implantation using boron (B) as ion species, having a dose amount of about $3.5 \times 10^{13}$ $cm^{-2}$ and an implantation energy of about 75 keV can be preferably exemplified.

The trench gate TG and the trench emitter TE are made of a polycrystal silicon layer doped with an n-type impurity formed so as to be buried inside trenches that are formed by etching to the main surface of the substrate SUB. By the gate insulating film GI, the trench gate TG and the trench emitter TE are electrically isolated from the semiconductor layer formed in the substrate SUB. A thickness of the gate insulating film GI is, for example, about 0.12 μm.

As a depth and a width of each trench, for example, 3.0 μm and 0.5 to 1.0 μm can be exemplified as preferable values, respectively. The trenches are arranged to form a stripe in a planar view, the trench gate TO and the trench emitter TE face each other so that the hole barrier layer HBL intervenes therebetween, and the p-type floating layer FL is arranged between the trench gate TO and the trench emitter TE. As a thickness (or a depth) of the p-type floating layer FL, for example, 4 to 5 μm can be exemplified as a preferable value. A base portion of the p-type floating layer FL is formed so as to cover a base portion of the trench to moderate the electric field concentration on a base surface of the trench gate TO.

The p-type base layer BL is formed by doping with a p-type impurity from the region of the front surface US of the substrate SUB. As this doping with the p-type impurity, for example, ion implantation using boron as ion species, having a dose amount of about $3\times10^{13}$ cm$^{-2}$ and an implantation energy of about 75 keV can be preferably exemplified.

The p-type base layer BL is formed on the n-type hole barrier layer HBL so as to be in contact with one side surface of the trench gate TO through the gate insulating film GI. And, the p-type base layer BL is formed on the n-type hole barrier layer HBL so as to be in contact with one side surface of the trench emitter TE through the gate insulating film GI.

The n-type emitter layer EL is formed by doping with an n-type impurity into the surface of the p-type base layer BL. As this doping with the n-type impurity, for example, ion implantation using arsenic as ion species, having a dose amount of about $5\times10^{15}$ cm$^{-2}$ and an implantation energy of about 80 keV can be preferably exemplified.

The interlayer insulating film IL is formed on the main surface of the substrate SUB so as to cover the n-type emitter layer EL, the p-type base layer BL and the p-type floating layer FL. The interlayer insulating film IL is a PSG (Phosphorus Silicate Glass) film formed by, for example, a CVD method or others. A thickness of the interlayer insulating film IL is, for example, about 0.6 μm. As a material of the interlayer insulating film IL, not only the PSG film but also a BPSG (Boron Phosphorus Silicate Glass) film, an NSG (Non-doped Silicate Glass) film, an SOG (Spin On Glass) film, a combined film made of these films and others can be preferably exemplified.

In the interlayer insulating film IL, the connection holes CH1 and CH2 are formed. The connection holes CH1 and CH2 can be formed by, for example, an anisotropic dry etching method using Ar gas, CHF$_3$ gas or others. By the anisotropic dry etching method, a part of the main surface of the substrate SUB exposed from the connection holes CH1 and CH2 is etched, and the connection holes CH1 and CH2 reaching the middle of the p-type base layer BL and the trench emitter TE are formed.

The p-type base contact layer BC can be formed by doping with a p-type impurity to the surface of the substrate SUB through the connection holes CH1 and CH2. As this doping with the p-type impurity, for example, ion implantation using boron as ion species, having a dose amount of about $1\times10^{15}$ cm$^{-2}$ and an implantation energy of about 100 keV can be preferably exemplified.

The emitter electrode EE is formed on the interlayer insulating film IL including insides of the connection holes CH1 and CH2. The emitter electrode EE is formed as a deposited film by, for example, the following procedure. First, a titanium tungsten film is formed as a barrier metal film on the main surface of the substrate SUB by, for example, a sputtering method. A thickness of the titanium tungsten film is, for example, about 0.2 μm.

Next, after execution of silicide annealing under, for example, nitrogen atmosphere at about 600° C. for about 10 minutes, an aluminum-based metal film is formed on the entire surface of the titanium tungsten film by, for example, a sputtering method so as to fill the insides of the connection holes CH1 and CH2. The aluminum-based metal film is made of, for example, an aluminum film added with silicon of several %, and has a thickness of about 5 μm.

Next, the emitter electrode EE made of the deposited film of the titanium tungsten film and the aluminum-based metal film can be formed into a predetermined pattern by a dry etching method using a resist pattern as a mask. As gas for this dry etching, for example, Cl$_2$/BCL$_3$ gas or others can be preferably exemplified.

The emitter electrode EE is electrically connected to each of the n-type emitter layer EL, the p-type base contact layer BC and the trench emitter TE through the interlayer insulating film IL.

Figure 5:
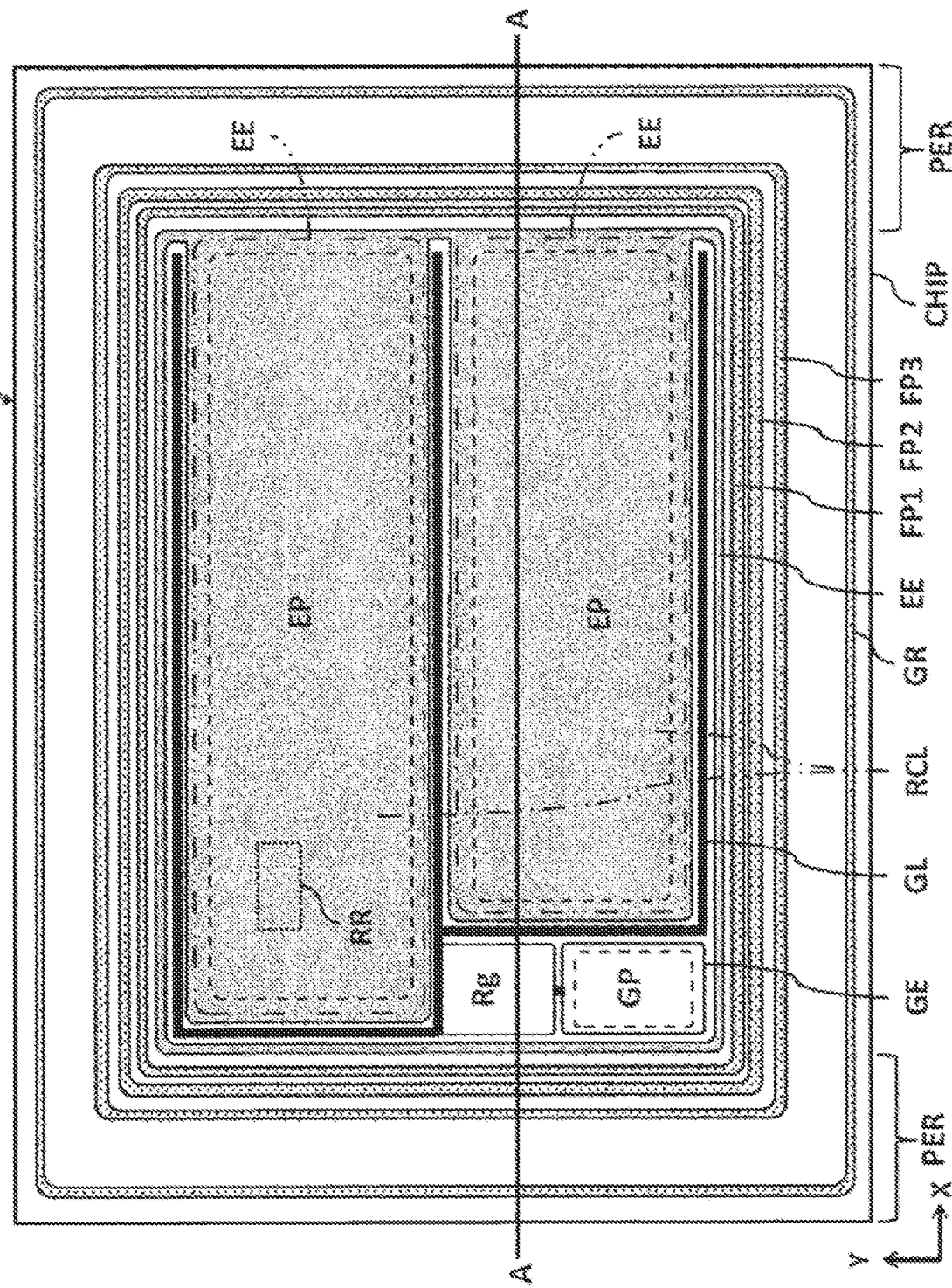
FIG. 5 is a plan view for explaining a planar structure of the semiconductor device including the IGBT according to one embodiment.

Next, the final passivation film FPF is formed on an upper side of the emitter electrode EE and an upper side of the interlayer insulating film IL. The final passivation film FPF is an organic film containing, for example, polyimide as a main component, and has a thickness of, for example, about 10 μm. The final passivation film FPF is formed by application of this organic film onto the entire upper surface of the emitter electrode EE and the entire upper surface of the interlayer insulating film IL, and then, by opening of a part of the emitter pad EP and a part of the gate pad GP by a regular lithography method as shown in FIG. 5 described later.

After the formation of the final passivation film FPF, for example, the following process is performed to the region of the back surface BS of the substrate SUB.

By a back grinding process to the back surface BS of the substrate SUB, a thickness of about 800 μm that is an initial thickness of the substrate SUB is reduced to be, for example, about 30 μm to 200 μm if needed. In order to design a breakdown voltage of the IE-type IGBT 100 to be, for example, about 600 V, it is preferable to set the final thickness of the substrate SUB to be about 70 μm. And, in order to remove damages of the back grinding process, chemical etching can be performed to the back surface BS if needed.

Next, the P-type collector layer CL and the dislocation suppressing layer DSL1 are formed by, for example, an ion implantation method for doping with a P-type impurity and germanium Ge to the thinned back surface BS of the substrate SUB. As conditions for the ion implantation for forming the P-type collector layer CL, for example, ion implantation using boron as ion species, having a dose amount of about $1 \cdot 10^{12}$ to $3\times10^{13}$ cm$^{-2}$ and an implantation energy of about 100 to 500 keV can be preferably exemplified. As conditions for the ion implantation for forming the dislocation suppressing layer DSL1, for example, ion implantation using germanium Ge as ion species, having a dose amount of about $1\times10^{16}$ to $1\times10^{17}$ cm$^{-2}$ and an implantation energy of about 200 to 900 keV (more preferably about 600 to 900 keV) can be preferably exemplified. Then, laser annealing is performed to the back surface BS of the substrate SUB if needed in order to activate the impurities.

Next, the field stop layer FSL is formed by, for example, an ion implantation method for doping with an N-type impurity to the thinned back surface BS of the substrate SUB. As conditions for this ion implantation, for example, ion implantation using hydrogen H as ion species, having a dose amount of about $1\times10^{14}$ to $1\times10^{15}$ cm$^{-2}$ and an implantation energy of about 300 to 400 keV can be preferably exemplified. Then, the substrate SUB is placed inside a furnace, and is subjected to low-temperature annealing at about 350 to 550° C. in the furnace, so that the field stop layer FSL is formed. The method of forming the field stop layer FSL also includes a method of forming the field stop layer FSL by the similar low-temperature annealing using oxygen as ion species to generate a thermal donor.

Next, the collector electrode CE is formed on the surface of the P-type collector layer CL by, for example, a sputtering method. The collector electrode CE is made of, for example, a deposited film of an aluminum (Al) layer, a titanium (Ti) layer, a nickel (Ni) layer, a gold (Au) layer and others in this order from the back surface BS of the substrate SUB.

By the above-described processes, the IE-type IGBT shown in FIG. 4 can be manufactured. In order to more specifically exemplify the device structure, one example of a principal dimension of each component of the device will be described here.

A gap "TPP" between the trench emitter TE and the trench gate TG is about 2 μm to 3 μm, a width "FLP" of the p-type floating layer FL is about 6 to 9 μm, and these are so-called a cell pitch and an inter-cell pitch, respectively. And, a depth of the n-type emitter layer EL is about 200 nm, a depth of the p-type base layer BL is about 0.6 to 1.0 μm, and a depth of the p-type floating layer FL is about 4 to 5 μm. And, a thickness of the n-type field stop layer FSL is about 2 to 5 μm, and a thickness of the p-type collector layer CL is about 1.0 μm. Note that the thickness of the substrate SUB can vary depending on the necessary breakdown voltage. As the thickness of the substrate SUB, for example, about 120 μm can be preferably exemplified in a case of the breakdown voltage of 1200 volts, and about 70 am can be preferably exemplified in a case of the breakdown voltage of 600 volts.

Figure 6:
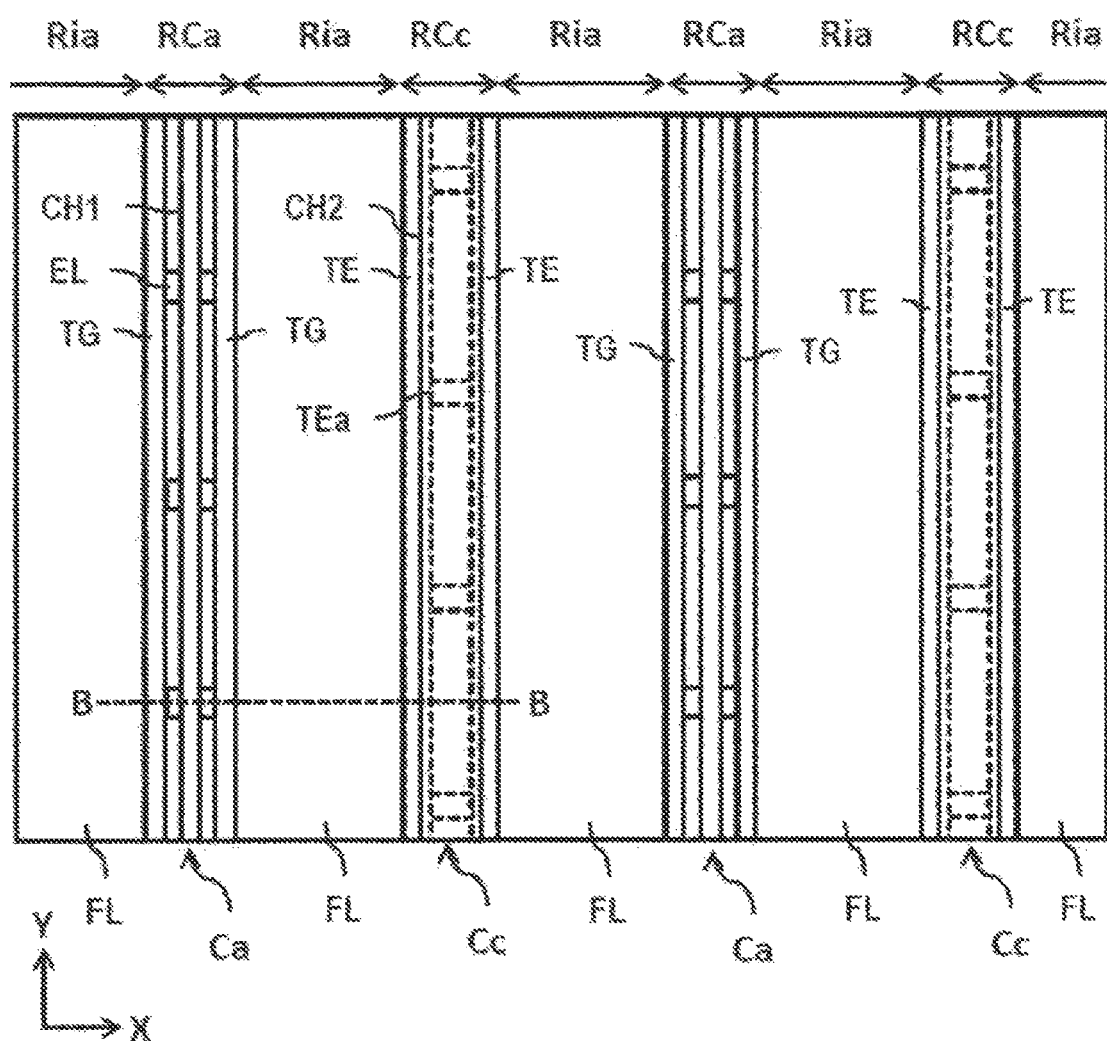
FIG. 6 is a diagram for explaining a cell formation region, that is a schematically-enlarged plan view of a region RR of FIG. 5.

FIG. 5 is a plan view of the semiconductor device including the IGBT according to one embodiment. FIG. 6 is a diagram for explaining a cell formation region, that is a schematically-enlarged plan view or a region RR of FIG. 5. FIG. 7 is a schematic cross-sectional view taken along a line A-A of FIG. 5.

In the IE-type IGBT 100, as shown in FIG. 5, an annular guard ring "GR" that is connected to an annular channel stopper (PG) is formed on an upper surface of an outer peripheral portion (also referred to as chip outer circumferential region) PER of the rectangular semiconductor chip CHIP. Inside the guard ring GR, several (single or plural) annular field plates FP (FP1, FP2, FP3, FP4 and FP5) that are connected to annular floating field rings (P1, P2, P3, P4 and P5) or others are formed. Each of the guard ring GR and the field plate FP is made of a metal film containing, for example, aluminum as a main element. In FIG. 5, illustration of FP4 and FP5 of the annular field plates FP is omitted for simplifying the drawing.

Inside the annular field plate FP, the cell formation region "RCL" is formed in a main portion of an activation portion of the semiconductor chip CHIP, and the emitter electrode EE is formed in an upper surface of the activation portion of the semiconductor chip CHIP so as to extend to a portion near the outer circumferential portion PER of the semiconductor chip CHIP. The emitter electrode EE is made of a metal film containing, for example, aluminum as a main element. A center portion of the emitter electrode EE is an emitter pad "EP" for connecting a bonding wire or others. The emitter pad EP is formed by formation of an opening in the final passivation film FPF.

A gate wiring "GL" is arranged between the emitter electrode EE and the emitter electrode EE or others, and the gate wiring GL is connected to the gate electrode GE through a gate resistor "Rg". Each of the gate wiring GL and the gate electrode GE is made of a metal film containing, for example, aluminum as a main element. A center portion of the gate electrode GE is a gate pad "GP" for connecting a bonding wire or others. The gate pad GP is formed by formation of an opening in the final passivation film FPF. The gate resistor Rg is made of a resistor film containing, for example, polycrystal silicon doped with am impurity of a desirable concentration as a main element.

In a configuration example shown in FIG. 5, three gate wirings GL are arranged so as to extend in a first direction "X", and the three gate wirings GL extending in the first direction X are connected to two gate wirings GL that are arranged so as to extend in a second direction "Y" crossing the first direction X. Below a region where the three gate wirings GL are formed, the three gate wirings GL extending in the first direction X are electrically connected to the polycrystal silicon layer doped with the n-type impurity buried inside the trench of the trench gate TG although not illustrated.

Next, with reference to FIG. 6, a configuration example of the cell formation region RCL will be explained. A cross-sectional view taken along a line B-B of FIG. 6 corresponds to the cross-sectional view of the IE-type IGBT shown in FIG. 4. The cell formation region RCL includes an activation cell region "RCa", an inactivation region "Ria" and a hole collector sell region "RCc". The activation cell region RCa, the inactivation region Ria and the hole collector sell region RCc are arranged to form a stripe pattern extending in the second direction Y. Four regions that are the activation cell region RCa, the inactivation region Ria, the hole collector sell region RCc and the inactivation region Ria are a set of one layout unit in this order, and are repetitively arranged in the first direction X.

An activation cell "Ca" is formed in the activation cell region RCa. As the activation cell Ca, FIG. 6 schematically illustrates a pair of trench gates TG arranged to form a stripe pattern extending in the second direction Y and the n-type emitter layer EL arranged between the pair of trench gates TG. A hole collector cell "Cc" is formed in the hole collector cell region RCc. As explained in FIG. 4, the hole collector cell Cc is the parasitic P-channel-type MOSFET, the source region of which is the p-type floating layer FL, the drain region of which is the p-type base layer BL, the channel formation region of which is the n-type hole barrier layer HBL and the gate electrode of which is the trench emitter TE. As the hole collector cell Cc, FIG. 6 schematically illustrates a pair of trench emitters TE arranged to forma stripe pattern extending in the second direction Y and a connecting trench emitter "Tea" connecting the pair of trench emitters TE. As the inactivation region Ria, FIG. 6 schematically illustrates the p-type floating layer FL. In a case of the contact as shown in the connection hole CH2 in FIG. 4, the connecting trench emitter TEa is unnecessary. In a case of the contact as shown in not the connection hole CH2 in FIG. 4 but the contact hole CH1, such a connecting trench emitter TEa connecting the emitter trench TE and the emitter electrode EE is better for the contact.

Next, with reference to FIG. 7, a cross-sectional view of the IE-type IGBT 100 will be explained. In FIG. 7, note that illustration of the final passivation film FPF and the collector electrode CE is omitted. Regarding the cell formation region RCL, FIG. 7 illustrates only three layers that are the trench emitter TE, the trench gate TG and the p-type floating layer FL in order to avoid the drawing from being complicated.

An outer region in periphery of the cell formation region RCL has a portion "RP0" (also referred to as, for example, cell peripheral junction region) where an annular P-type well region "P0" is formed so as to surround the outer region, and this P-type well region P0 is electrically connected to the emitter electrode EE. The plurality of annular p-type floating field rings P1, P2, P3, P4 and P5 are arranged outside the annular P-type well region P0. The floating field rings P1, P2, P3, P4 and P5 are connected to the field plates FP1, FP2, FP3, FP4 and FP5. An annular n-type channel stopper "PG" is formed outside the p-type floating field rings P1, P2, P3, P4 and P5. The channel stopper PG is connected to the guard ring GR. The channel stopper PG is set to a collector potential. The outer circumferential portion PER of the semiconductor chip CHIP and the cell peripheral junction region RPG can be also regarded as a peripheral region arranged so as to surround the cell formation region RCL.

As shown in FIG. 7, the dislocation suppressing layer DSL1 is formed inside the P-type collector layer CL. The dislocation suppressing layer DSL1 is arranged in the entire semiconductor chip CHIP of FIG. 5 in a planar view. In other words, the dislocation suppressing layer DSL1 is arranged in the outer circumferential portion PER of the semiconductor chip CHIP, the cell peripheral junction region RP0 and the cell formation region RCL. The dislocation suppressing layer DSL1 shown in FIG. 7 can be replaced with the dislocation suppressing layer DSL2 shown in FIG. 3.

(Method of Manufacturing Semiconductor Device)

Next, a method of manufacturing the semiconductor device will be explained. The method of manufacturing the semiconductor device includes the following steps.

(Step of Preparing Substrate) is a step of preparing the silicon substrate SUB including the n-type emitter layer EL, the p-type base layer BL, the trench gate TO, the trench emitter TE, the p-type floating layer FL, the n-type hole barrier layer HBL, the gate electrode GE and the emitter electrode EE that are formed in the region of the first main surface US.

(Step of Forming p-type Collector Layer: First Step) is a step of forming the p-type collector layer CL on the second main surface BS facing the first main surface US of the silicon substrate SUB.

(Step of Forming Dislocation Suppressing Layer: Second Step) is a step of forming the dislocation suppressing layer (DSL1, DSL2) forming the hetero junction with the silicon substrate SUB, in the p-type collector layer CL.

(Step of Forming n-type Field Stop Layer: Third Step) is a step of forming the n-type field stop layer FSL on the p-type collector layer CL in the region of the first main surface US.

(Step of Forming Collector Electrode: Fourth Step) is a step of forming the collector electrode CE connected to the p-type collector layer CL.

In the above-described steps, the step of forming the p-type collector layer and the step of forming the dislocation suppressing layer can be regarded as a combined step. A manufacturing process of forming the p-type collector layer CL and the dislocation suppressing layer will be explained below.

(Method of Manufacturing IGBT Including Dislocation Suppressing Layer DSL1)

Figure 8:
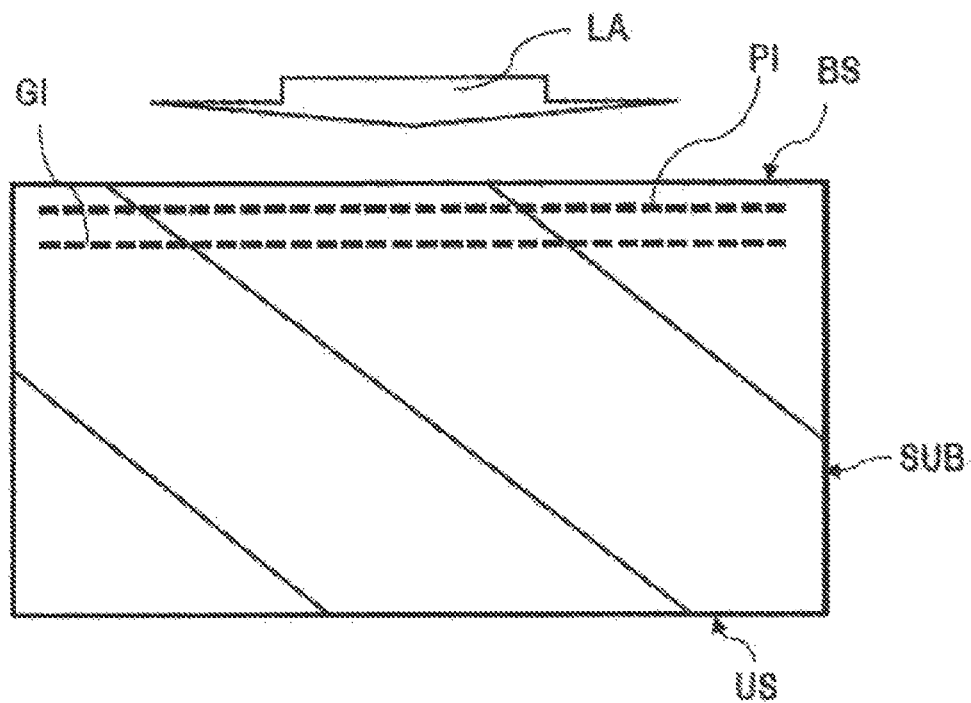
FIG. 8 is cross-sectional view for explaining a method of manufacturing a region of a back surface of a semiconductor device including an IGBT.
Figure 9:
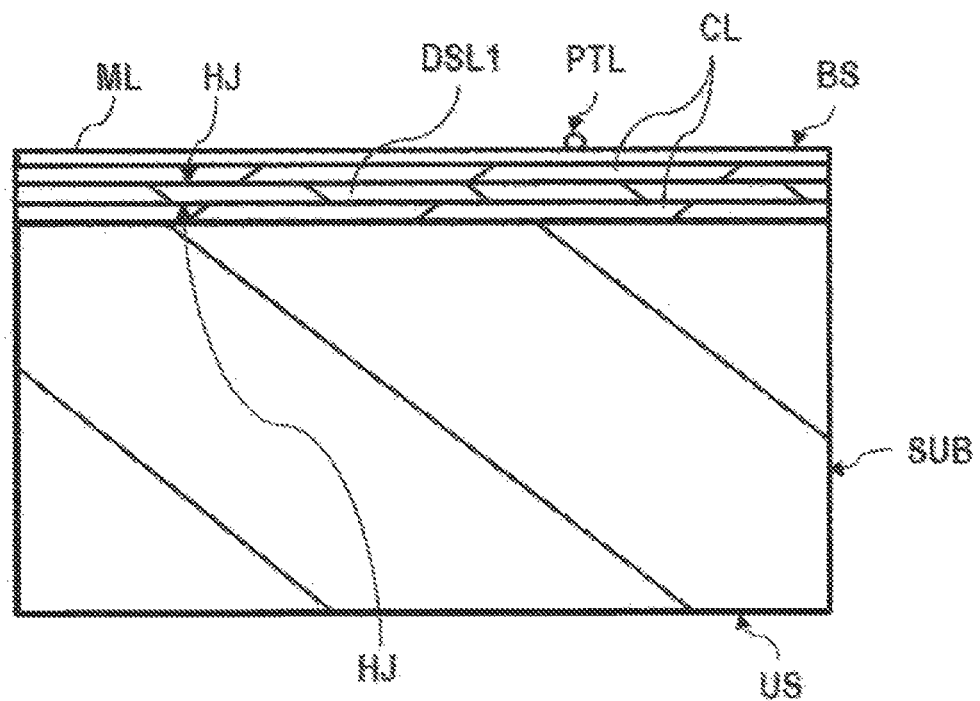
FIG. 9 is a cross-sectional view for explaining the method of manufacturing the same, continued from FIG. 8.
Figure 10:
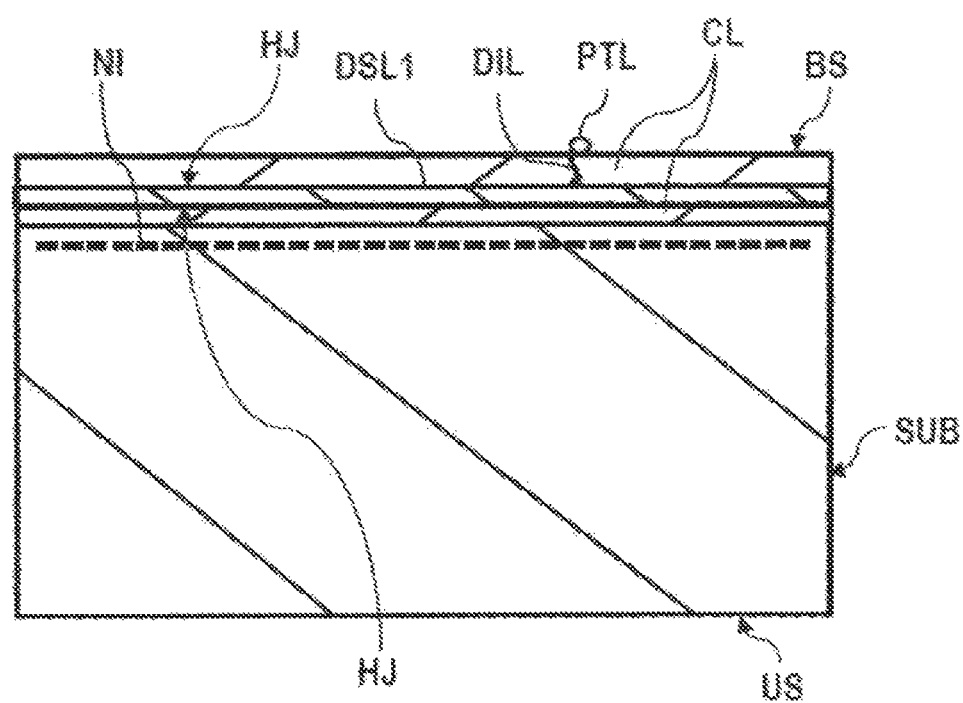
FIG. 10 is a cross-sectional view for explaining the method of manufacturing the same, continued from FIG. 9.
Figure 11:
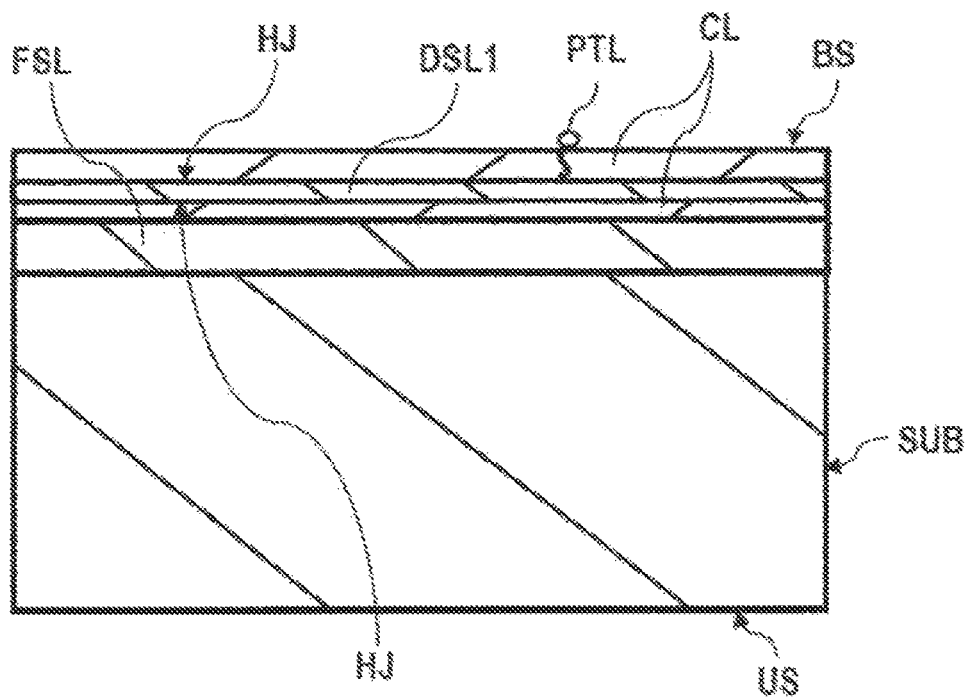
FIG. 11 is a cross-sectional view for explaining the method of manufacturing the same, continued from FIG. 10.

Next, with reference to FIGS. 8 to 11, a method of manufacturing the IE-type IGBT including the dislocation suppressing layer DSL1 will be explained. FIG. 8 is a cross-sectional view for explaining the method of manufacturing the region of the back surface of the semiconductor device including the IGBT. FIG. 9 is a cross-sectional view for explaining the method of manufacturing the same, continued from FIG. 8. FIG. 10 is a cross-sectional view for explaining the method of manufacturing the same, continued from FIG. 9. FIG. 11 is a cross-sectional view for explaining the method of manufacturing the same, continued from FIG. 10. In this explanation, the n-type emitter layer EL, the p-type base layer BL, the p-type base contact layer BC, the trench gate TG, the trench emitter TE, the p-type floating layer FL, the n-type hole barrier layer HBL, the interlayer insulating film IL, the emitter electrode EE, the final passivation film FPF and others that are formed in the region of the front surface US of the substrate SUB are omitted.

As shown in FIG. 8, in order to from the P-type collector layer CL and the dislocation suppressing layer DSL1 after the back grinding process, a P-type-impurity implanted layer "PI" and a germanium implanted layer "GEI" are formed by, for example, an ion implantation method for the doping with the P-type impurity and germanium Ge into the back surface BS of the substrate SUB. Then, the P-type-impurity implanted layer PI and the germanium implanted layer GEI are activated by the laser annealing to the back surface BS of the substrate SUB. As conditions for the ion implantation for forming the P-type collector layer CL, for example, ion implantation using boron as ion species, having a dose amount of about $1 \times 10^{12}$ to $3 \times 10^{13}$ cm$^{-2}$ and an implantation energy of about 100 to 500 keV is designed. As conditions for the ion implantation for forming the dislocation suppressing layer DSL1, for example, ion implantation using germanium Ge as ion species, having a dose amount of about $1 \times 10^{16}$ to $1 \times 10^{17}$ cm$^{-2}$ and an implantation energy of about 600 to 900 keV is designed.

As shown in FIG. 9, by the laser annealing LA to the back surface of the substrate SUB, the impurity implanted layers PI and GEI are activated, so that the P-type collector layer CL and the dislocation suppressing layer DSL1 are formed. At the time of the laser emission in the laser annealing LA, about 0.2 μm thickness of the silicon on the outermost surface of the back surface BS of the substrate SUB is melted once to form the melting layer ML. After the laser emission, a temperature of the substrate SUB decreases, and the melting layer ML is recrystallized. The hetero junction HJ made of the silicon layer and the silicon germanium (SiGe) layer is formed on both upper and lower surfaces of the dislocation suppressing layer DSL1.

In this step, as shown in FIG. 10, when the particles PTL exist on the surface of the melting layer ML, the dislocation defect DIL starting from the particles PTL as a start point is formed in the back surface BS of the substrate SUB in some cases in the recrystallization. The hetero junction HJ that is formed on the upper and lower surfaces of the dislocation suppressing layer DSL1 suppresses this dislocation defect DIL from extending to the portion below the dislocation suppressing layer DSL1.

Next, the field stop layer FSL is formed by, for example, an ion implantation method for the doping with the N-type impurity into the back surface BS of the substrate SUB. As conditions for this ion implantation, for example, ion implantation using hydrogen H as ion species, having a dose amount of about $1 \times 10^{14}$ to $1 \times 10^{15}$ cm$^{-2}$ and an implantation energy of about 300 to 400 keV is designed. Note that the dislocation suppressing layer DSL1 may be formed after the formation of the field stop layer FSL. In other words, the laser annealing LA for forming the dislocation suppressing layer DSL1 is preferable to be performed at a last stage of the manufacturing method or so.

Then, the substrate SUB is placed inside the furnace, and the substrate SUB is subjected to the low-temperature annealing at about 350 to 550° C. in the furnace, so that the field stop layer FSL is formed as shown in FIG. 11. Then, although not illustrated, the collector electrode CE is formed on the surface of the P-type collector layer CL by, for example, a sputtering method. In these processes, the semiconductor device including the IGBT is formed.

(Method of Manufacturing IGBT including Dislocation Suppressing Layer DSL2)

Figure 12:
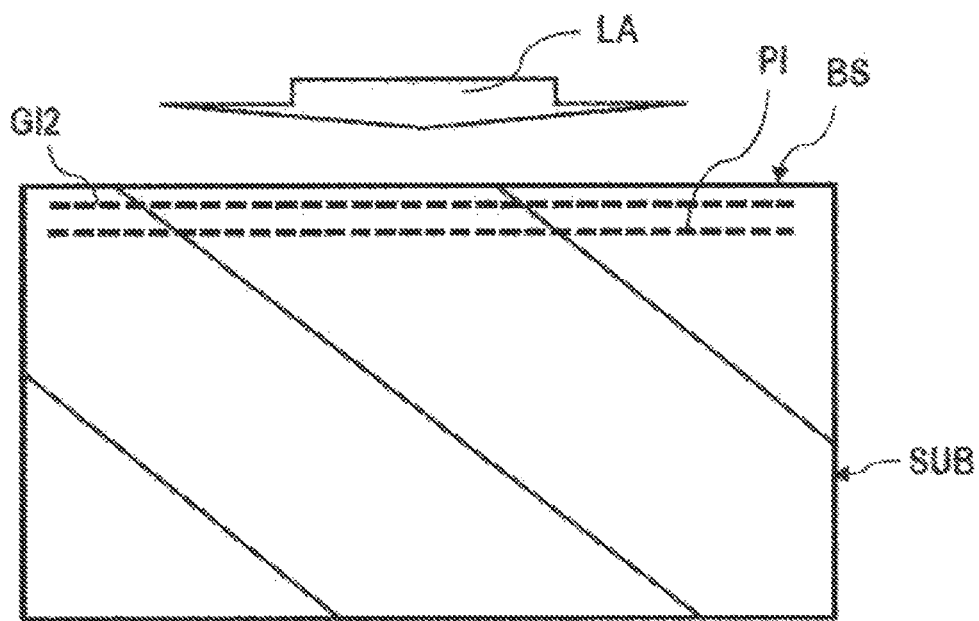
FIG. 12 is a cross-sectional view for explaining a method of manufacturing a region of a back surface of a semiconductor device including an IGBT.
Figure 13:
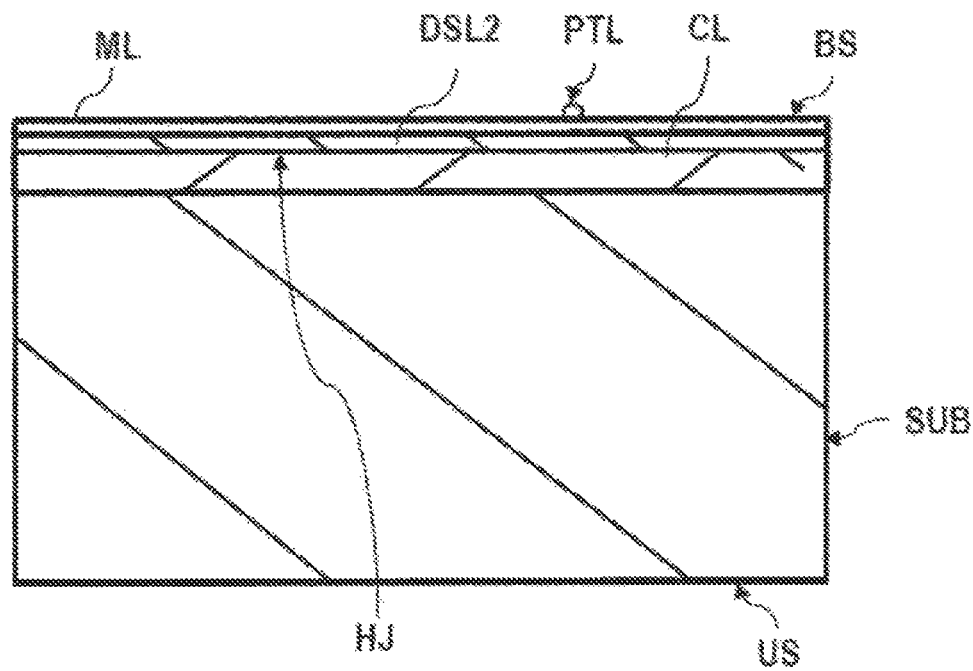
FIG. 13 is a cross-sectional view for explaining the method of manufacturing the same, continued from FIG. 12.

Next, with reference to FIGS. 12 to 13, a method of manufacturing the IE-type IGBT including the dislocation suppressing layer DSL2 will be explained. FIG. 12 is a cross-sectional view for explaining the method of manufacturing the region of the back surface of the semiconductor device including the IGBT. FIG. 13 is a cross-sectional view for explaining the method of manufacturing the same, continued from FIG. 12. In this explanation, the n-type emitter layer EL, the p-type base layer BL, the p-type base contact layer BC, the trench gate TG, the trench emitter TE, the p-type floating layer FL, the n-type hole barrier layer HBL, the interlayer insulating film IL, the emitter electrode EE, the final passivation film FPF and others that are formed in the region of the surface US of the substrate SUB are omitted.

As shown in FIG. 12, in order to from the P-type collector layer CL and the dislocation suppressing layer DSL2 after the back grinding process, a P-type-impurity implanted layer "PI" and a germanium implanted layer "GEI2" are formed by, for example, the ion implantation method for the doping with the P-type impurity and germanium Ge into the back surface BS of the substrate SUB. Then, the P-type-impurity implanted layer PI and the germanium implanted layer GEI2 are activated by the laser annealing to the back surface BS of the substrate SUB. As conditions for the ion implantation for forming the P-type collector layer CL, for example, ion implantation using boron as ion species, having a dose amount of about $1 \cdot 10^{12}$ to $3 \cdot 10^{13}$ cm$^{-2}$ and an implantation energy of about 100 to 500 keV is designed. As conditions for the ion implantation for forming the dislocation suppressing layer DSL2, for example, ion implantation using germanium Ge as ion species, having a dose amount of about $1 \cdot 10^{-16}$ to $1 \times 10^{17}$ cm$^{-2}$ and an implantation energy of about 150 to 500 keV is designed, and this implantation energy can be lower than the implantation energy (for example, about 600 to 900 keV) for forming the dislocation suppressing layer DSL1. In other words, the dislocation suppressing layer DSL2 is formed at the shallow position from the back surface BS, and therefore, can be formed by the ion implantation at the low acceleration energy.

As shown in FIG. 13, by the laser annealing LA to the back surface of the substrate SUB, the impurity implanted layers PI and GEI2 are activated, so that the p-type collector layer CL and the dislocation suppressing layer DSL2 are formed. At the time of the laser emission in the laser annealing LA, about 0.2 μm thickness of the silicon on the outermost surface of the back surface BS of the substrate SUB is melted once to form the melting layer ML. After the laser emission, a temperature of the substrate SUB decreases, and the melting layer ML is recrystallized. The hetero junction is not formed in the portion of the dislocation suppressing layer DSL2 in the region closer to the back surface BS (in FIG. 13, the upper surface of the dislocation suppressing layer DSL2) because the portion overlaps the melting layer ML, but the hetero junction HJ made of the silicon layer and the silicon germanium (SiGe) layer is formed in the portion of the dislocation suppressing layer DSL2 in the region farther from the back surface BS (in FIG. 13, the lower surface of the dislocation suppressing layer DSL2).

In this step, when the particles PTL exist on a surface of the melting layer ML, the dislocation defect OIL starting from the particles PTL as a start point is formed in the back surface BS of the substrate SUB in some cases in the recrystallization. The hetero junction HJ that is formed on the lower surface of the dislocation suppressing layer DSL2 suppresses this dislocation defect DIL from extending to the portion below the dislocation suppressing layer DSL2.

After the process of FIG. 13, the same manufacturing steps as the manufacturing steps explained in FIGS. 10 and 11 are performed. Then, the collector electrode CE is formed on the surface of the P-type collector layer CL. In these processes, the semiconductor device including the IGBT is formed.

MODIFICATION EXAMPLES

Next, some of modification examples will be explained.

First Modification Example

Figure 14:
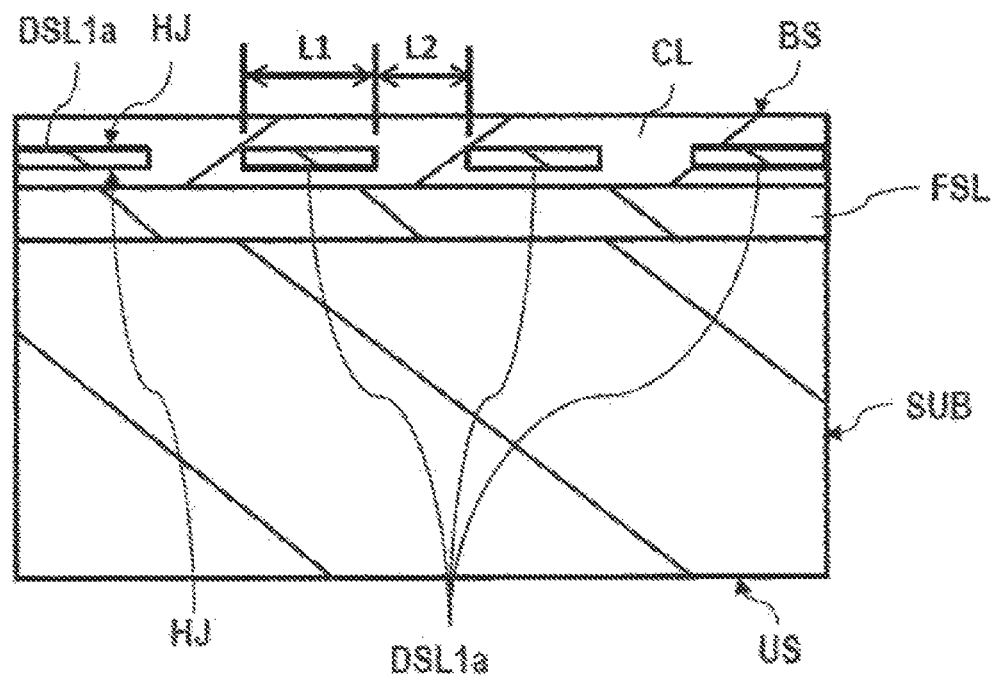
FIG. 14 is a cross-sectional view for explaining a structure of a region of a back surface of a semiconductor device including an IGBT according to a first modification example.
Figure 15:
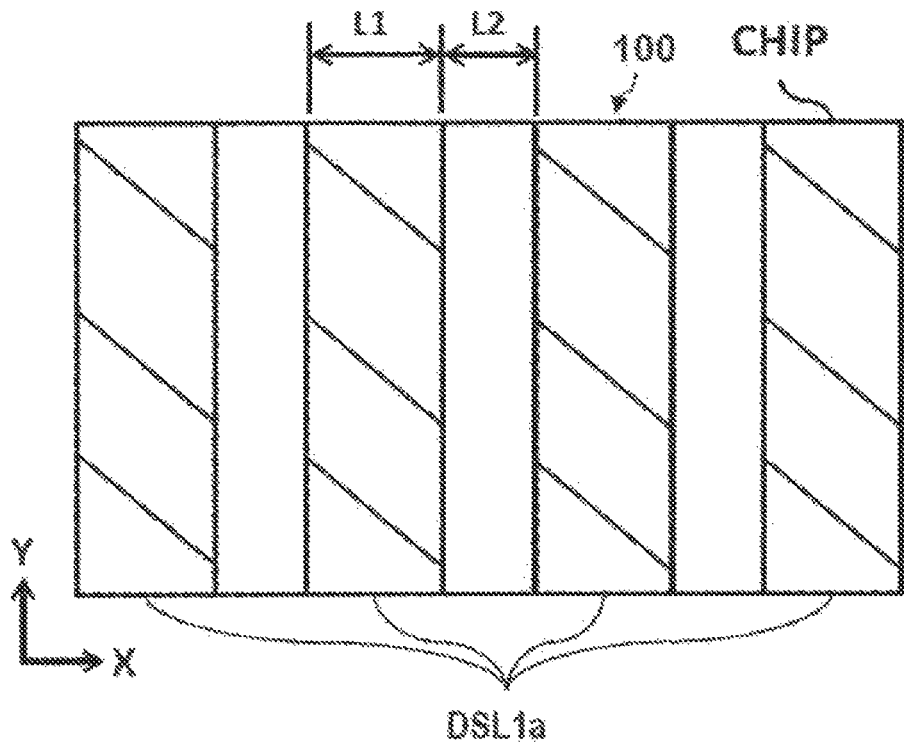
FIG. 15 is a plan view of the semiconductor device including the IGBT according to the first modification example.
Figure 16:
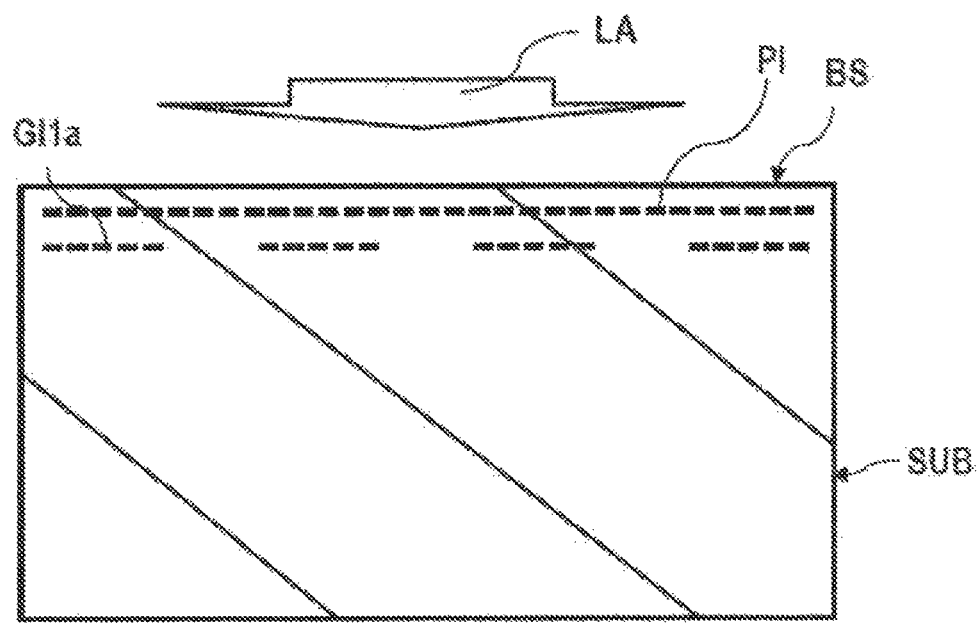
FIG. 16 is a cross-sectional view for explaining a method of manufacturing the region of the back surface of the semiconductor device including the IGBT according to the first modification example.
Figure 17:
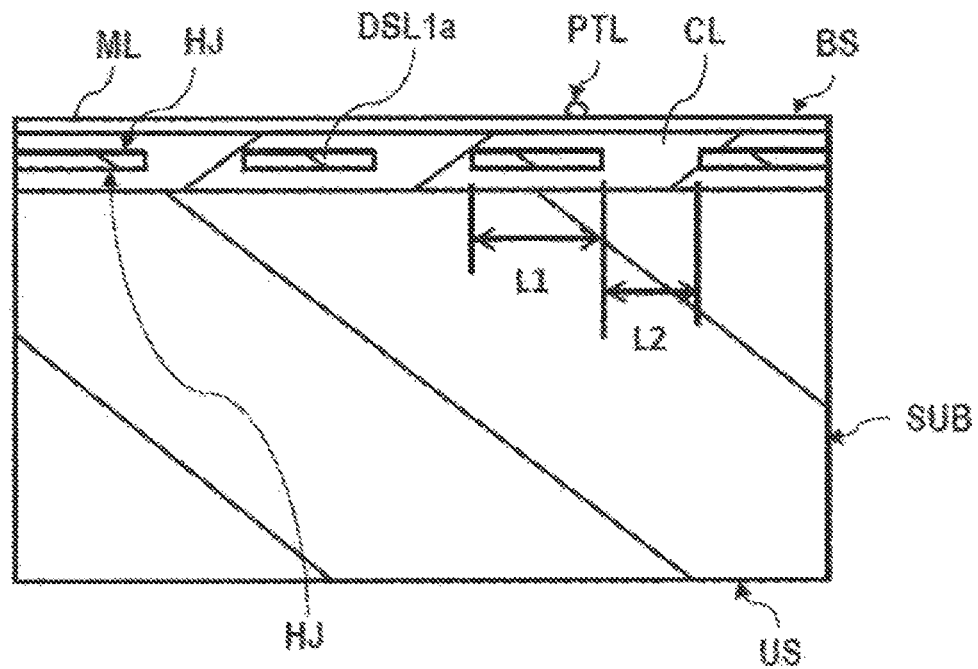
FIG. 17 is a cross-sectional view for explaining the method of manufacturing the same, continued from FIG. 16.

FIG. 14 is a cross-sectional view for explaining a structure of a region of a back surface of a semiconductor device including an IGBT according to a first modification example. FIG. 15 is a plan view of the semiconductor device including the IGBT according to the first modification example. FIG. 16 is a cross-sectional view for explaining a method of manufacturing the region of the back surface of the semiconductor device including the IGBT according to the first modification example. FIG. 17 is a cross-sectional view for explaining the method of manufacturing the same, continued from FIG. 16.

A difference of FIG. 14 from FIG. 11 is that the dislocation suppressing layer DSL1a is divided into a plurality of pieces as shown in FIGS. 14 and 15. Each of the dislocation suppressing layers DSL1a has a width "L1" in the first direction X, and the plurality of dislocation suppressing layers DSL1a are arranged so that a gap (space) having a width "L2" intervenes therebetween. As shown in FIG. 15, each of the plurality of dislocation suppressing layers DSL1a is selectively formed inside the silicon substrate SUB in a planar view. In the example of FIG. 15, the plurality of dislocation suppressing layers DSL1a are arranged so as to form a stripe pattern extending in the second direction Y, and are lined in the first direction X. In the example shown in FIG. 15, the planar-view form of the plurality of dislocation suppressing layers DSL1a is the stripe (rod form), but is not limited to this. The planar-view form of the plurality of dislocation suppressing layers DSL1a may be rectangular, circular, elliptical, polygonal or others.

Since the plurality of divided dislocation suppressing layers DSL1a are formed as shown in FIG. 16, the germanium implanted layer GEI1a is formed so as to be divided into a plurality of pieces (the formation of the germanium implanted layer GEI1a can be referred to in the explanation for the germanium implanted layer GEI of FIG. 8). In this case, a mask for blocking the impurity doping is formed by a photolithography step, and then, the germanium implanted layer GEI1a is formed by the ion implantation with germanium Ge in the usage of the mask for blocking the impurity doping as a mask for the ion implantation, and then, a mask removal step of removing the mask for blocking the impurity doping and other are performed.

After the formation of the P-type-impurity implanted layer PI (see the explanation of FIG. 8) and the germanium implanted layer GEI1a, the P-type-impurity implanted layer PI and the germanium implanted layer GEI1a are activated by the laser annealing to the back surface BS of the substrate SUB. And, as shown in FIG. 17, the P-type-impurity implanted layer PI and the germanium implanted layer GEI1a are activated by the laser annealing LA to the back surface of the substrate SUB, so that each of the P-type collector layer CL and the dislocation suppressing layer DSL1a made of the silicon germanium layer is formed. After the process of FIG. 17, the same manufacturing steps as the manufacturing steps explained in FIGS. 10 and 11 are performed. Then, the collector electrode CE is formed on the surface of the P-type collector layer CL. In these processes, the semiconductor device including the IGBT is formed.

As shown in FIG. 17, when the particles PTL exist on an upper side of the dislocation suppressing layer DIL1a, the dislocation defect starting from the particles PTL as a start point can be suppressed from extending to the portion below the dislocation suppressing layer DSL1a by the hetero junction HJ that is formed on the upper and lower surfaces of the dislocation suppressing layer DSL1a.

However, when the particles PTL exist in a gap between the dislocation suppressing layer DSL1a and the dislocation suppressing layer DSL1a, it is conceivable that the dislocation defect starting from the particles PTL as the start point undesirably extends to the portion below the P-type collector layer CL through the gap (in a gap of the width L2) between the dislocation suppressing layer DSL1a and the dislocation suppressing layer DSL1a, which results in leakage failure. A second modification example explained below is for solving this problem.

Second Modification Example

Figure 18:
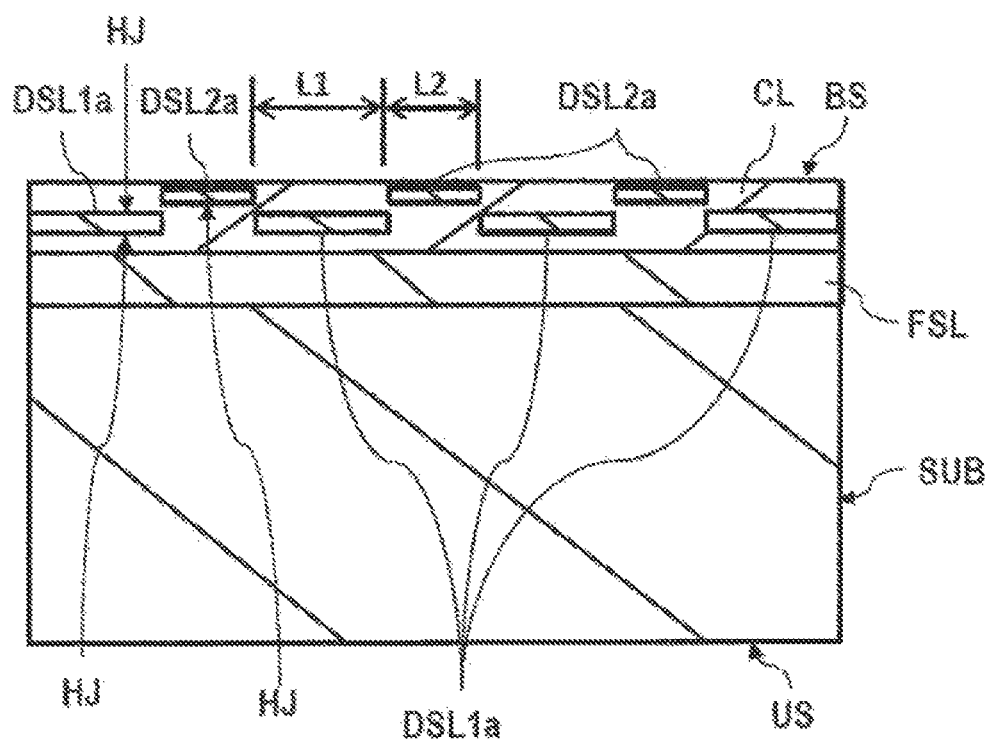
FIG. 18 is a cross-sectional view for explaining a structure of a region of a back surface of a semiconductor device including an IGBT according to a second modification example.
Figure 19:
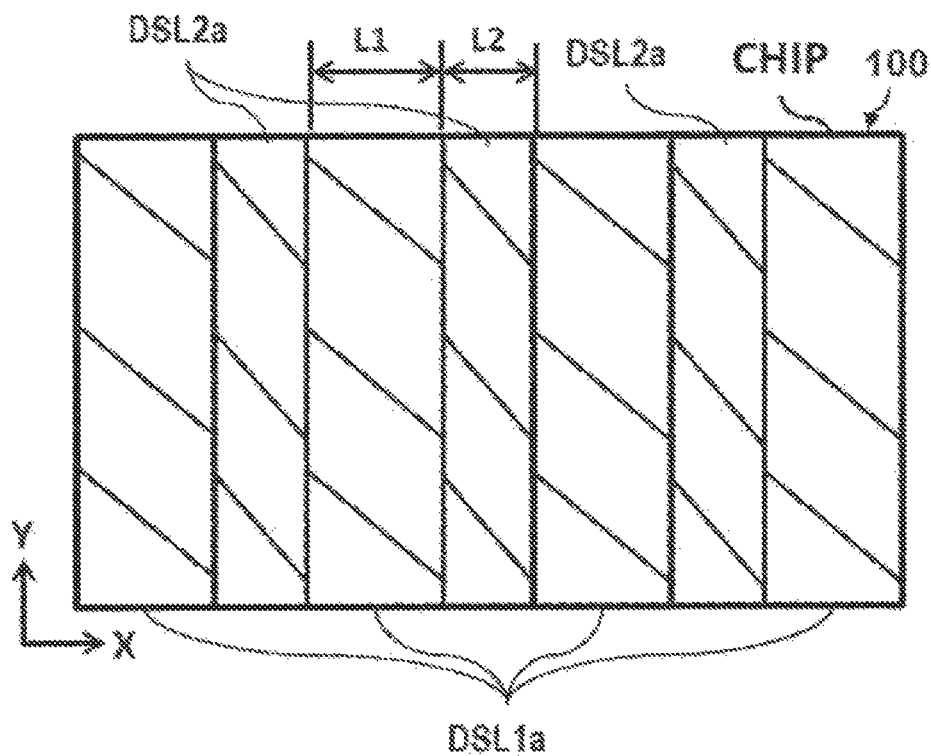
FIG. 19 is a plan view of the semiconductor device including the IGBT according to the second modification example.
Figure 20:
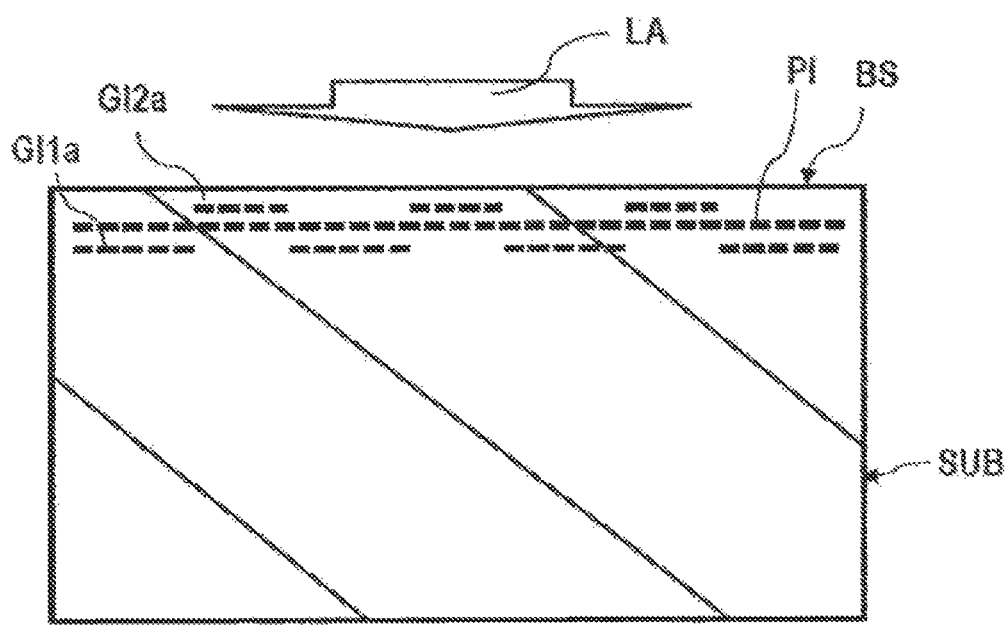
FIG. 20 is a cross-sectional view for explaining a method of manufacturing the region of the back surface of the semiconductor device including the IGBT according to the second modification example.
Figure 21:
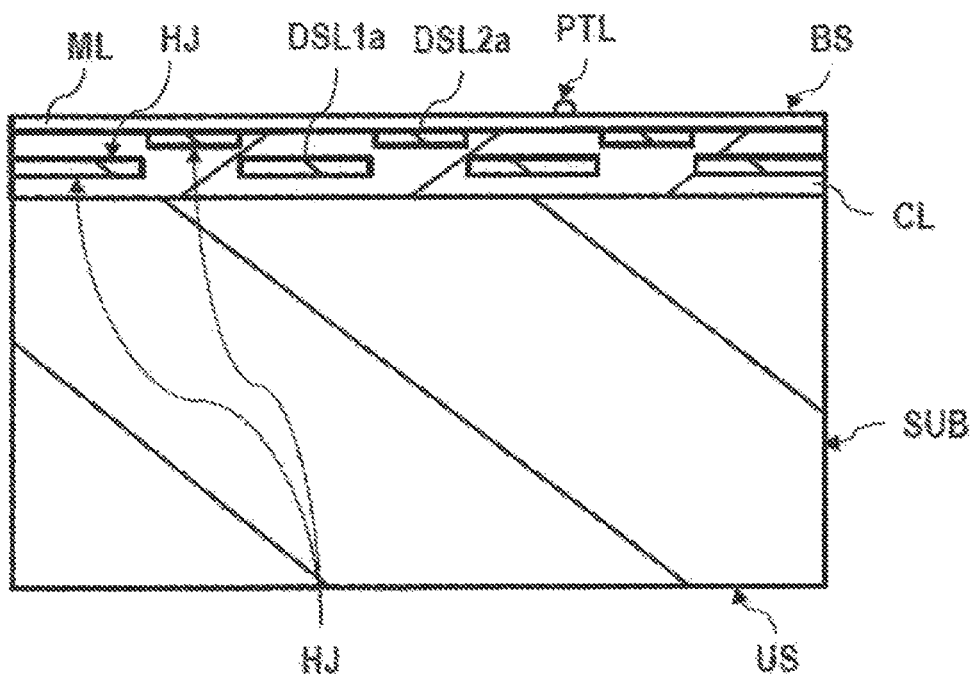
FIG. 21 is a cross-sectional view for explaining the method of manufacturing the same, continued from FIG. 20.

FIG. 18 is a cross-sectional view for explaining a structure of a region of a back surface of a semiconductor device including an IGBT according to the second modification example. FIG. 19 is a plan view of the semiconductor device including the IGBT according to the second modification example. FIG. 20 is a cross-sectional view for explaining a method of manufacturing the region of the back surface of the semiconductor device including the IGBT according to the second modification example. FIG. 21 is a cross-sectional view for explaining the method of manufacturing the same, continued from FIG. 20.

A difference of FIG. 18 from FIG. 14 is that the dislocation suppressing layer DSL2a is formed near the back surface BS of the substrate SUB in the region having the width L2 between the dislocation suppressing layers DSL1a as shown in FIGS. 18 and 19. Each of the dislocation suppressing layers DSL1a has a width L1 in the first direction X, and the plurality of dislocation suppressing layers DSL1a are arranged so that a gap having the width L2 intervenes therebetween. Each of the dislocation suppressing layers DSL2a made of the silicon germanium layer has the width L2 in the first direction X, and the plurality of dislocation suppressing layers DSL2a are arranged so that a gap having the width L1 intervenes therebetween. As shown in FIG. 19, the plurality of dislocation suppressing layers DSL1a and the plurality of dislocation suppressing layers DSL2a are arranged so as to form a stripe pattern extending in the second direction Y, and are alternately lined in the first direction X in a planar view.

These processes solve the problem such as the undesirable extension of the dislocation defect starting from the particles PTL as the start point to the portion below the P-type collector layer CL through the gap (in the gap of the width L2) between the dislocation suppressing layer DSL1a and the dislocation suppressing layer DSL1a. In other words, in the dislocation suppressing layer DSL2a between the dislocation suppressing layer DSL1a and the dislocation suppressing layer DSL1a, the hetero junction HJ made of the silicon layer and the silicon germanium (SiGe) layer is formed on the portion of the dislocation suppressing layer DSL2a far-her from the back surface BS (in FIC. 18, on the lower surface of the dislocation suppressing layer DSL2). The hetero junction HJ that is formed on the lower surface of the dislocation suppressing layer DSL2a suppresses the extension of this dislocation defect to the portion below the dislocation suppressing layer DSL2a.

Therefore, the dislocation defect starting from the particles PTL as the start point is suppressed from extending to the portion below the dislocation suppressing layer DSL1a and the dislocation suppressing layer DSL2a by the hetero junction HJ formed on the upper and lower surfaces of the dislocation suppressing layer DSL1a and the hetero junction HJ formed on the lower surface of the dislocation suppressing layer DSL2a.

The planar-view form of the plurality of dislocation suppressing layers DSL1a may be triangular, rectangular, circular, elliptical, polygonal or others. In this case, the planar-view form of the dislocation suppressing layers DSL2a is such a form as covering a region where the plurality of dislocation suppressing layers DSL1a are not formed. The planar-view form of the plurality of dislocation suppressing layers DSL2a may be triangular, rectangular, circular, elliptical, polygonal or others. In this case, the planar-view form of the dislocation suppressing layers DSL1a is such a form as covering a region where the plurality of dislocation suppressing layers DSL2a are not formed.

Since the plurality of divided dislocation suppressing layers DSL1a and dislocation suppressing layers DSL2a are formed as shown in FIG. 20, a germanium implanted layer GEI1a is formed so as to be divided into a plurality of pieces, and a germanium implanted layer GEI2a is formed so as to be divided into a plurality of pieces (the formation of the germanium implanted layer GEI2a can be referred to in the explanation for the germanium implanted layer GEI2 of FIG. 12). The germanium implanted layer GEI1a and the germanium implanted layer GEI2a are formed by the photolithography step using the mask for blocking the impurity doping as explained in FIG. 16.

After the formation of the P-type-impurity implanted layer PI (see the explanation of FIG. 8), the germanium implanted layer GEI1a and the germanium implanted layer GEI2a, the P-type-impurity implanted layer PI, the germanium implanted layer GEI1a and the germanium implanted layer GEI2a are activated by the laser annealing to the back surface BS of the substrate SUB. And, as shown in FIG. 21, the PI and the germanium implanted s GEI1a and GEI2a are activated by the laser annealing LA to the back surface of the substrate SUB, so that the dislocation suppressing layer DSL1a, the dislocation suppressing layer DSL2a and the P-type collector layer CL are formed. After the process of FIG. 21, the same manufacturing steps as the manufacturing steps explained in FIGS. 10 and 11 are performed. Then, the collector electrode CE is formed on the surface of the P-type collector layer CL. In these processes, the semiconductor device including the IGBT is formed.

Third Modification Example

Figure 22:
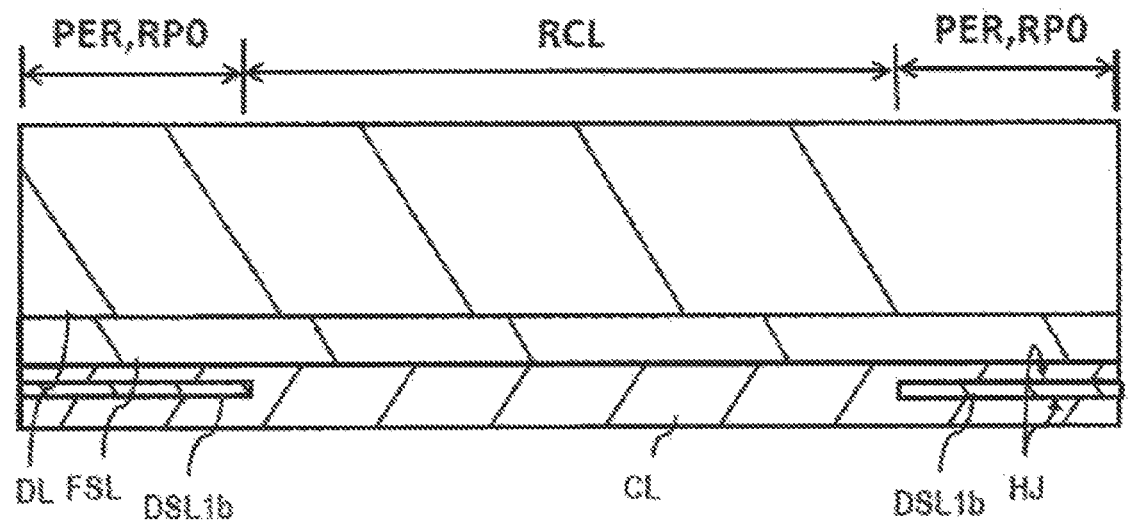
FIG. 22 is a cross-sectional view for explaining a structure of a region of a back surface of a semiconductor device including an IGBT according to a third modification example.
Figure 23:
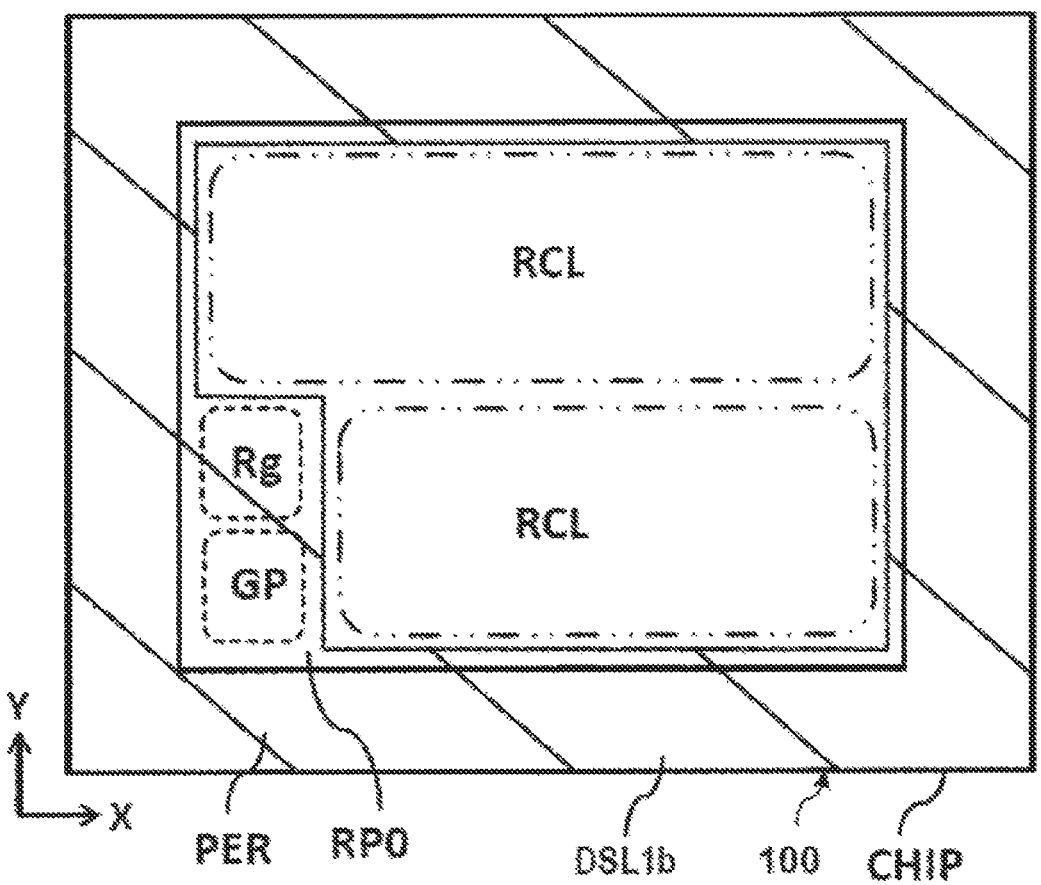
FIG. 23 is a plan view of the semiconductor device including the IGBT according to the third modification example.

FIG. 22 is a cross-sectional view for explaining a structure of a region of a back surface of a semiconductor device including an IGBT according to the third modification example. FIG. 23 is a plan view of the semiconductor device including the IGBT according to the third modification example.

In the first modification example, the structure example in which the plurality of dislocation suppressing layers DSL1a are arranged to form the stripe pattern in the semiconductor chip CHIP in a planar view has been explained. As shown in FIG. 22, the third modification example is configured so that a dislocation suppressing layer DSL1b is selectively formed in a region except for a lower portion of the cell formation region RCL, in other words, in the chip outer circumferential region PER of the semiconductor chip CHIP and a lower region of the cell peripheral junction region RP0. As shown in FIG. 23, the dislocation suppressing layer DSL1b is formed inside the P-type collector layer CL below the cell peripheral junction region RP0 surrounding the periphery of the cell formation region RCL and below the chip outer circumferential region PER surrounding the periphery of the cell peripheral junction region RP0. A method of manufacturing the dislocation suppressing layer DSL1b can be referred to in the explanation for the first modification example.

Adoption of the dislocation suppressing layer DSL1b as shown in FIG. 23 can suppress the electric current leakage at the time of reverse bias. Further, since the cell formation region RCL has no dislocation suppressing layer DSL1b, the adoption does not affect the property of the IGBT.

Fourth Modification Example

Figure 24:
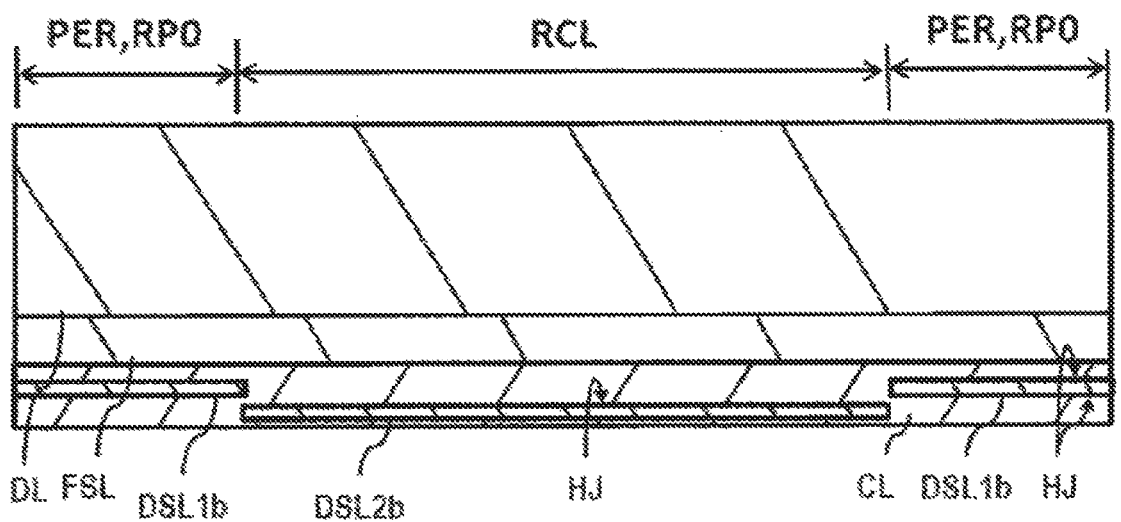
FIG. 24 is a cross-sectional view for explaining a structure of a region of a back surface of a semiconductor device including an IGBT according to a fourth modification example.
Figure 25:
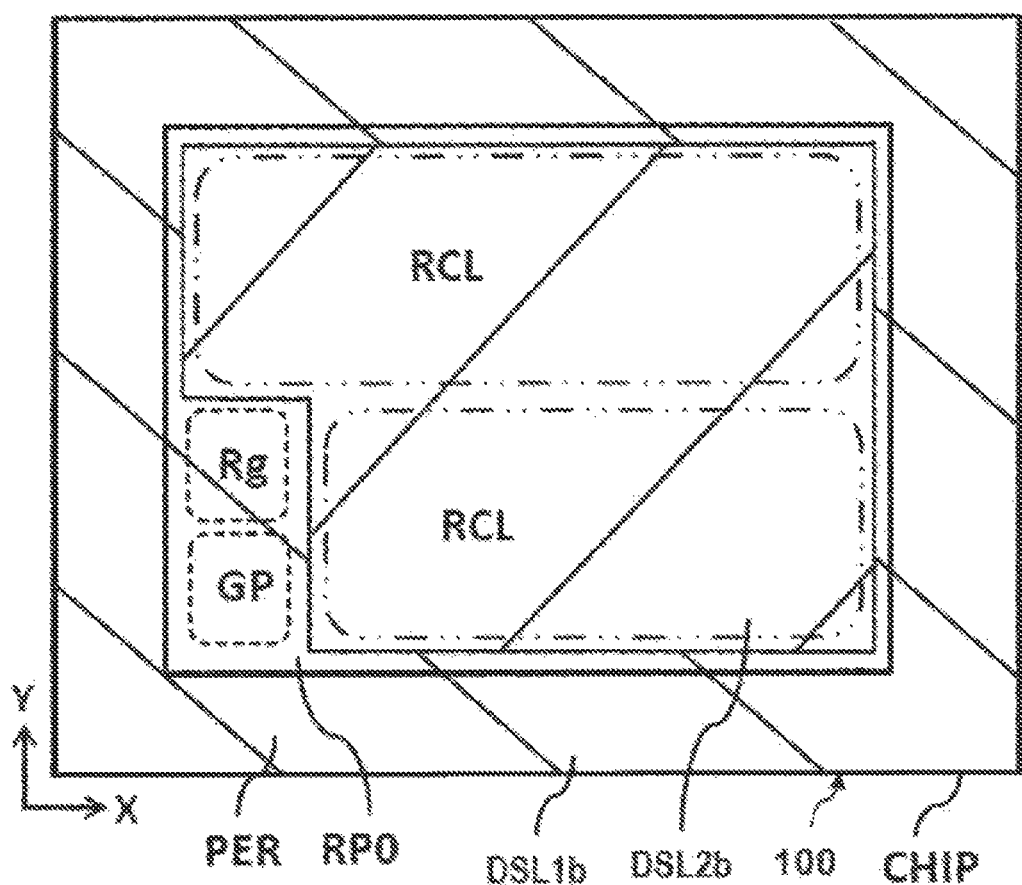
FIG. 25 is a plan view of the semiconductor device including the IGBT according to the fourth modification example.

FIG. 24 is a cross-sectional view for explaining a structure of a region of a back surface of a semiconductor device including an IGBT according to the fourth modification example. FIG. 25 is a plan view of the semiconductor device including the IGBT according to the fourth modification example.

A difference of FIG. 24 from FIG. 22 is that a dislocation suppressing layer DSL2b is formed inside the P-type collector layer CL below the cell formation region RCL. As shown in FIG. 25, the dislocation suppressing layer DSL2b is formed in a region below the cell formation region RCL in a planar view. A method of manufacturing the dislocation suppressing layer DSL2b can be referred to in the explanation for the second modification example.

According to the fourth modification example, the IE-type IGBT 100 includes the dislocation suppressing layers DSL1b and DSL2b, and therefore, can suppress the electric current leakage between the emitter and the collector and the electric current leakage at the time of reverse bias.

Fifth Modification Example

In FIG. 18, in place of the dislocation suppressing layer DSL1a doped with germanium Ge, a dislocation suppressing layer based on a lattice spacing strain layer (extension defect) made with silicon Si in the substrate SUB can be formed by ion implantation for doping with any one of ion species such as carbon C, silicon Si, argon Ar, fluorine F, nitrogen N and others. In FIG. 18, the holes are implanted through the dislocation suppressing layer DSL2a, and therefore, even the formation of the dislocation suppressing layer doped with such ion species at a position other than the formation region of the dislocation suppressing layer DSL2a does not deteriorate the output property of the IGBT.

Sixth Modification Example

In FIG. 22, in place of the dislocation suppressing layer DSL1b doped with germanium Ge, a dislocation suppressing layer based on a lattice spacing strain layer (extension defect) made with silicon Si in the substrate SUB can be formed by ion implantation for doping with any one of ion species such as carbon C, silicon Si, argon Ar, fluoride F, nitrogen N and others. In FIG. 22, no dislocation suppressing layer is formed below the cell formation region RCL, and therefore, even the formation of the dislocation suppressing layer doped with such ion species (carbon C, silicon Si, argon Ar, fluoride F, nitrogen N) at a position of the formation region of the dislocation suppressing layer DSL1b does not deteriorate the output property of the IGBT. In FIG. 24, note that the dislocation suppressing layer DSL1b is also made of the dislocation suppressing layer using such ion species.

(Explanation for Study Made by Inventors)

Next, findings from the studies made by the inventors will be explained.

Figure 26:
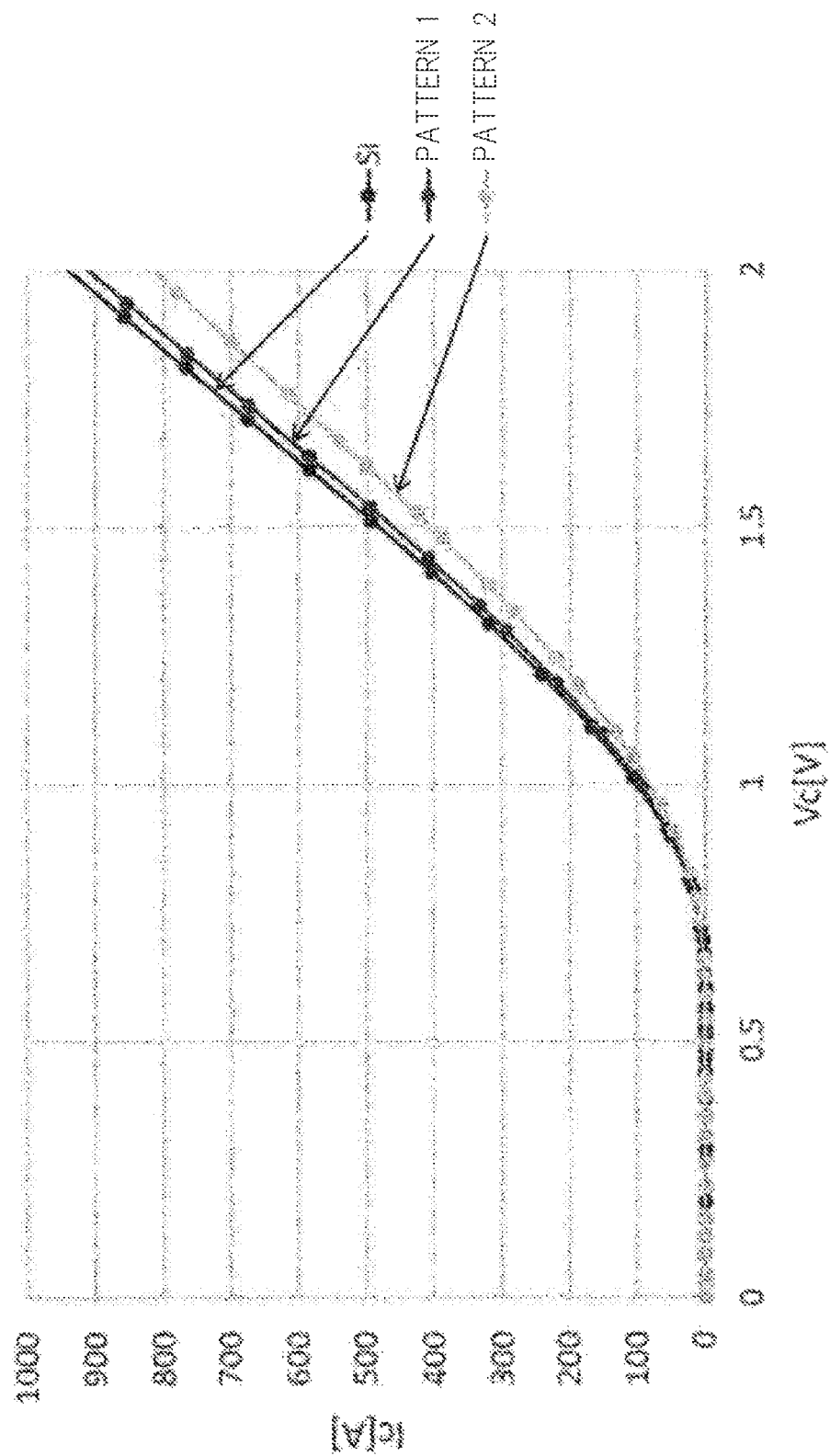
FIG. 26 is a graph showing output property of three IGBTs having different back-surface structures from one another.

FIG. 26 is a graph showing the output properties of the three IGBTs having different back surface structures from one another. FIG. 26 shows the output property of each of the IGBT (referred to as "Si") shown in FIG. 1C, the IGBT (referred to as "pattern 1") shown in FIG. 3 and the IGBT (referred to as "pattern 2") shown in FIG. 2. In FIG. 26, a horizontal axis indicates a volt "V" of a collector potential (Vc), and a vertical axis indicates an electric current "A" of a collector electric current "Ic". Note that a structure of the region of the front surface of each IGBT is the same as the structure of the region of the front surface of the IGBT shown in FIG. 4.

Figure 1C:
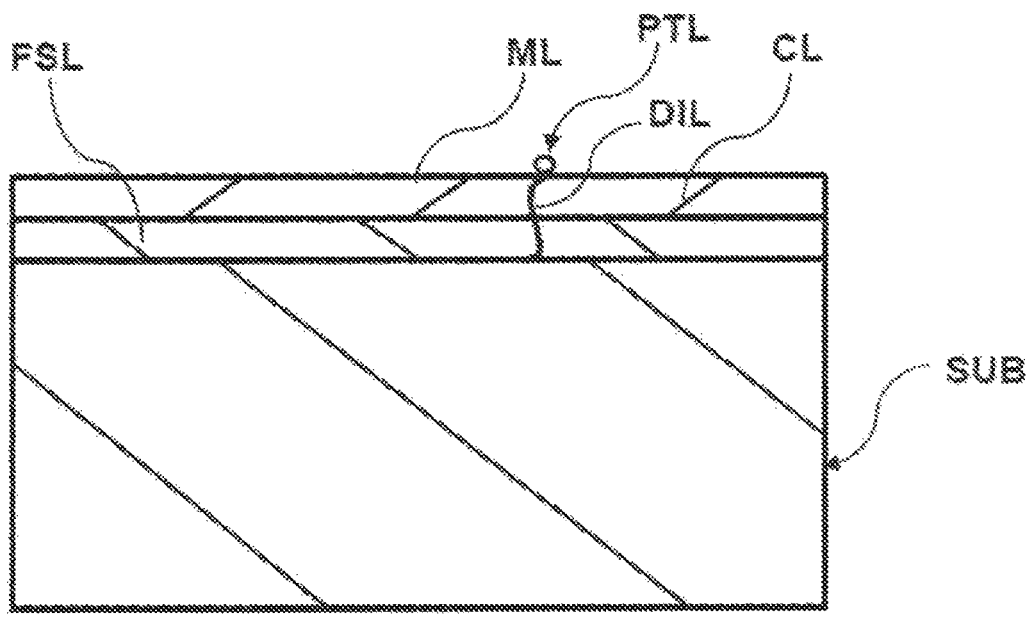
FIG. 1C is a cross-sectional view of a principal part for explaining the method of manufacturing the same, continued from FIG. 1B.

As shown in FIG. 26, the pattern 1 (the IGBT in FIG. 3) is almost the same in the property as the Si (the IGBT in FIG. 1C). However, in the pattern 2 (the IGBT in FIG. 2), the output reduction is observed. For example, at the collector voltage Vc: 1.5 V, the electric-current reduction of about 20% is observed in the pattern 2 (the IGBT in FIG. 2) as compared to the Si (the IGBT in FIG. 1C).

The premise is that the formation of the dislocation suppressing layers DSL1 and DSL2 made of the SiGe layer by the ion implantation with Ge to the back surface results in the blocking of the hole doping from the back surface. This is because silicon Si and SiGe are different in a band structure.

The pattern 1 (the dislocation suppressing layer DSL2 in FIG. 3) is formed to be shallow. In other words, the SiGe layer is formed in the surface region of the back surface BS. Therefore, the ion implantation is performed at a relatively-low acceleration energy (150 to 500 keV). Therefore, the width of the SiGe layer (the dislocation suppressing layer DSL2) in the depth direction can be decreased (in other words, the implantation profile of Ge can be sharpened).

In the pattern 2 (the dislocation suppressing layer DSL1 in FIG. 2), the ion implantation with Ge is performed at a relatively-high acceleration energy (600 to 900 keV). Therefore, the width of the SiGe layer in the depth direction is increased. This is because the higher the acceleration energy is, the larger the ion scattering is, which results in the broader profile because of the property of the ion implantation. As a result, it is considerable that the pattern 2 (the IGBT in FIG. 2) causing the wide SiGe layer (dislocation suppressing layer DSL1) deteriorates the output property.

Figures 27, 28:
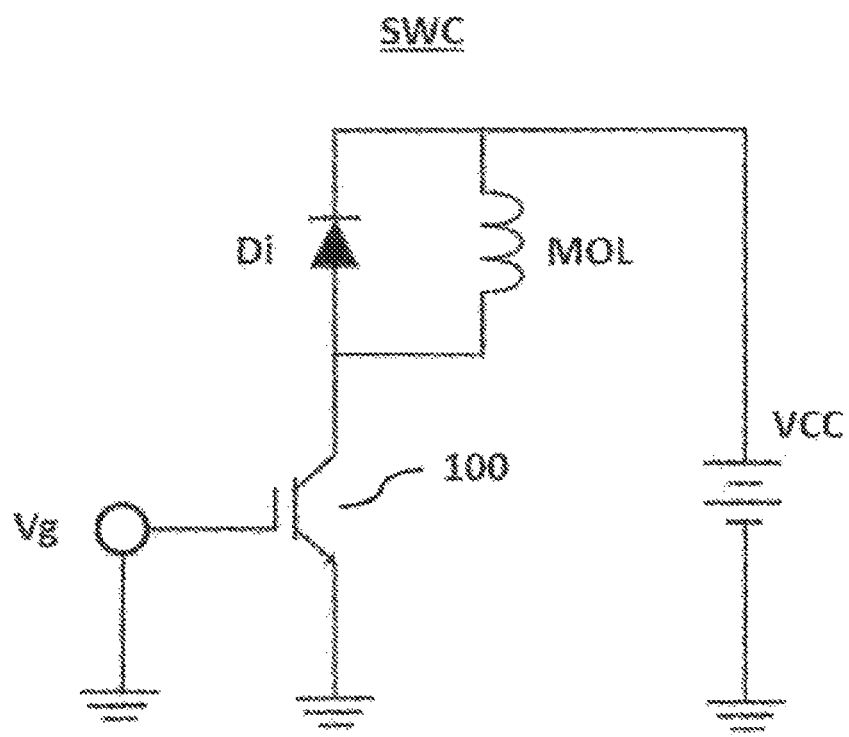
FIG. 27 is a circuit diagram showing a switching circuit for use in simulation.
FIG. 28 is a diagram for explaining a switching loss value calculated by the simulation.

Next, the switching property of the IGBT has been evaluated by simulation. One example of a principal part of the switching circuit including a trench insulated gate bipolar transistor used for the simulation will be briefly explained. FIG. 27 is a circuit diagram showing the switching circuit used for the simulation. FIG. 28 is a diagram for explaining a value of switching loss calculated by the simulation.

As shown in FIG. 27, in the switching circuit SWC, the IGBT 100 is electrically connected in series to, for example, a motor serving as a main load MOL. To this main load MOL, a freewheeling diode Di is electrically connected in parallel. To the main load MOL, a power supply voltage VCC is electrically connected. The IGBT 100 is a target for the evaluation. The IGBT 100 is turned ON/OFF by control for the gate potential Vg of the IGBT 100 in at state in which an electric current of 200 A flows through the switching circuit SWC. The switching loss in this case is shown in FIG. 28. In FIG. 28, a term "Eon" indicates the switching loss at the time of the turning ON, and a term "Eoff" indicates the switching loss at the time of the turning OFF.

It is verified that the switching property of the pattern 1 (the IGBT in FIG. 3) is almost the same as that of the Si (Ref. (Si): the IGBT in FIG. 1C) exemplified as the reference. On the other hand, the Eoff of the pattern 2 (the IGBT in FIG. 2) is better by about 15%. This is because an ON voltage of the pattern 2 is high as shown in FIG. 26, which results in a low carrier density in a bulk. The trade-off between the output property and the switching property is simply observed.

From the above-described results, it is found that the IGBT characteristics can be maintained when being formed as shown in the pattern 1 (the IGBT in FIG. 3) even in the adoption of the SiGe layer on the back surface.

However, in the pattern 1 and the pattern 2, the pattern 2 is higher in the robust performance than the pattern 1. This means that the pattern 2 includes two layers of the hetero junction HJ serving as the dislocation stopper since the upper and lower surfaces of the SiGe layer become the hetero interfaces (hetero junctions HJ). On the other hand, this is because only the lower surface of the SiGe layer in the pattern 1 becomes the hetero interface (hetero junction HJ).

Figure 29:
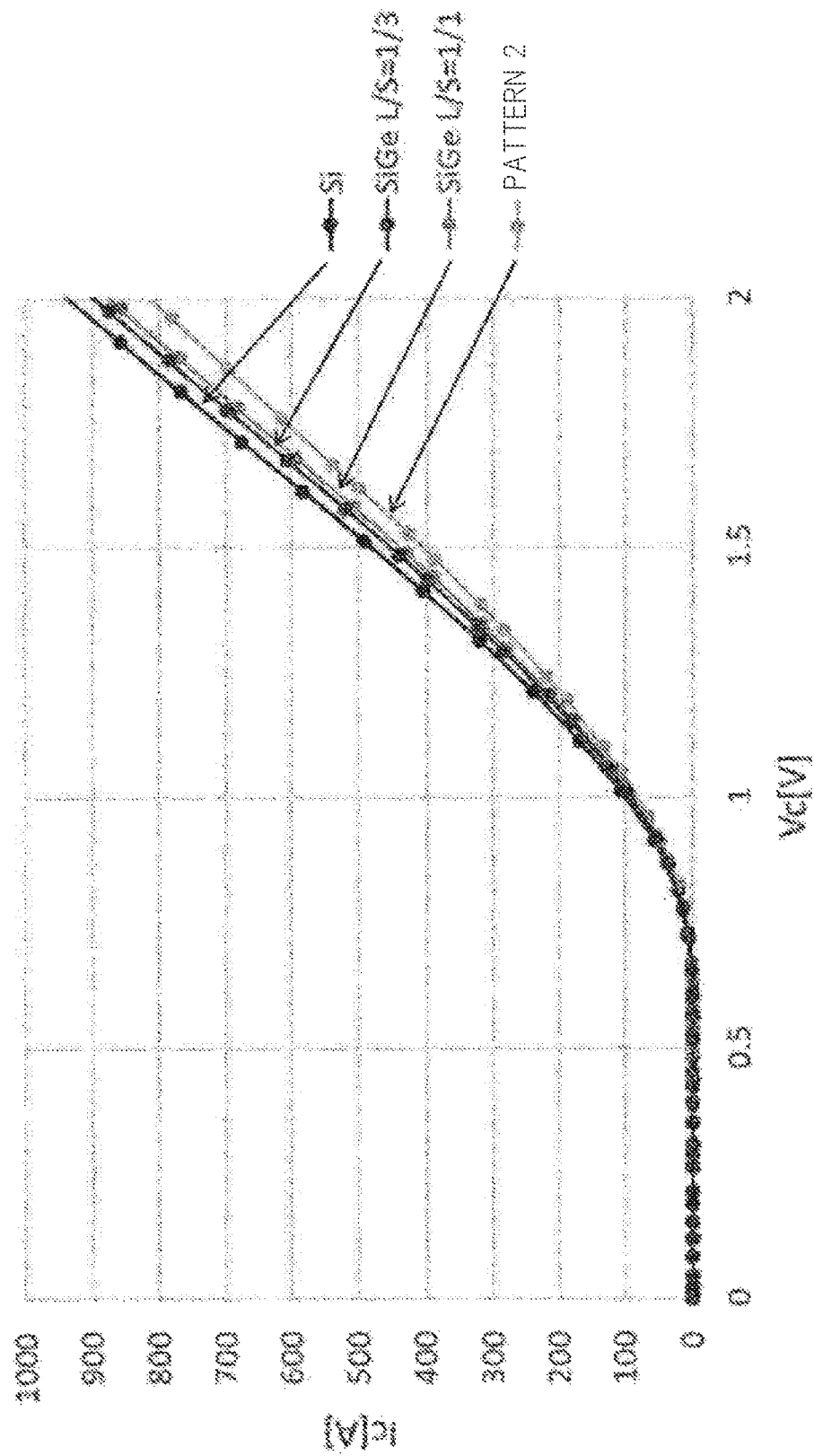
FIG. 29 is results of the output property of each IGBT calculated under change of a ratio (L1/L2) of a width L1 of a dislocation suppressing layer DSL1$a$ and a width L2 between the dislocation suppressing layers DSL1$a$.

The dislocation suppressing layer DSL1a of the first modification example (FIG. 14) is structured so that the space having the width L2 is formed between the dislocation suppressing layers DSL1a, the plurality of which are formed by dividing the dislocation suppressing layer DSL1 of the pattern 2 (FIG. 2). Since the holes output from the collector electrode CE in the region of the back surface BS of the substrate SUB pass through the space having the width L2 between the dislocation suppressing layers DSL1a, the improvement of the output property is expected. FIG. 29 is results of the output property of each IGBT calculated under a change of a ratio (L1/L2) of the width L1 of the dislocation suppressing layer DSL1a and the width L2 between the dislocation suppressing layers DSL1a. FIG. 29 shows four IGBTs in a case of the Si (the IGBT in FIG. 1C), a case of the pattern 2 (the IGBT in FIG. 2), a case of "L1/L2=1/1" (expressed as SiGe L/S=1/1) and a case of "L1/L2=1/3" (expressed as SiGe L/S=1/3).

It has been verified that the output property can be improved by the structure having the space (L2) between the dislocation suppressing layers DSL1a. Of course, it has been also verified that the larger the space width (L2) is, the more the improvement of the output property is.

Meanwhile, in this structure, when the dislocation defect DIL occurs in the region of the space (L2), the leakage failure may occur since the region of the space (L2) has no hetero junction HJ serving as the dislocation stopper. From FIG. 26, it has been already found that the case of the pattern 1 does not deteriorate the output property of the IGBT. Therefore, from the above-described results, it is estimated that both the output property and the robust performance of the IGBT can be improved by the formation of the dislocation suppressing layer DSL2 of the pattern 1 in the space (L2) of FIG. 14. Accordingly, a pattern 3 shown in a second modification example (FIG. 18) can be newly suggested. The pattern 3 shown in the second modification example (FIG. 18) can maintain almost the same performance (the output property and the switching loss) as those of the IGBT in FIG. 1C while increasing the robust performance.

(Regarding Reverse Bias)

Figure 30:
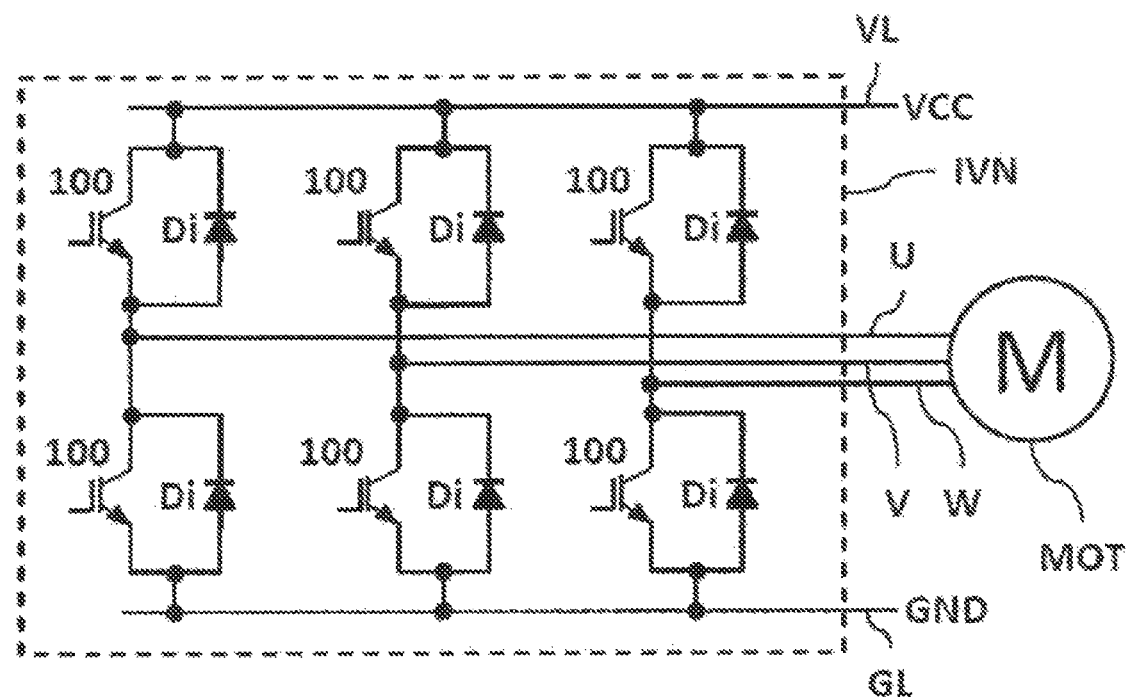
FIG. 30 is a circuit block diagram showing one example of a motor driving circuit.
Figure 31:
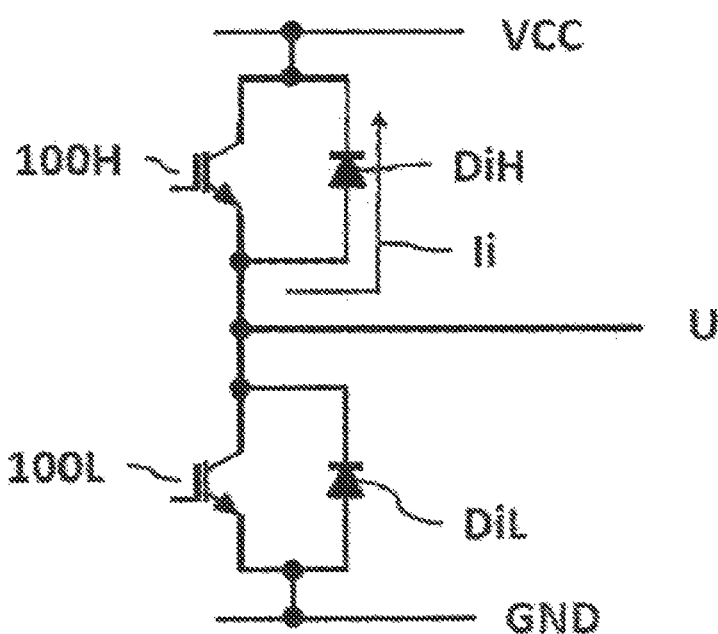
FIG. 31 is a circuit diagram for explaining operations of an IGBT and a diode corresponding to a U phase of FIG. 30.
Figure 32:
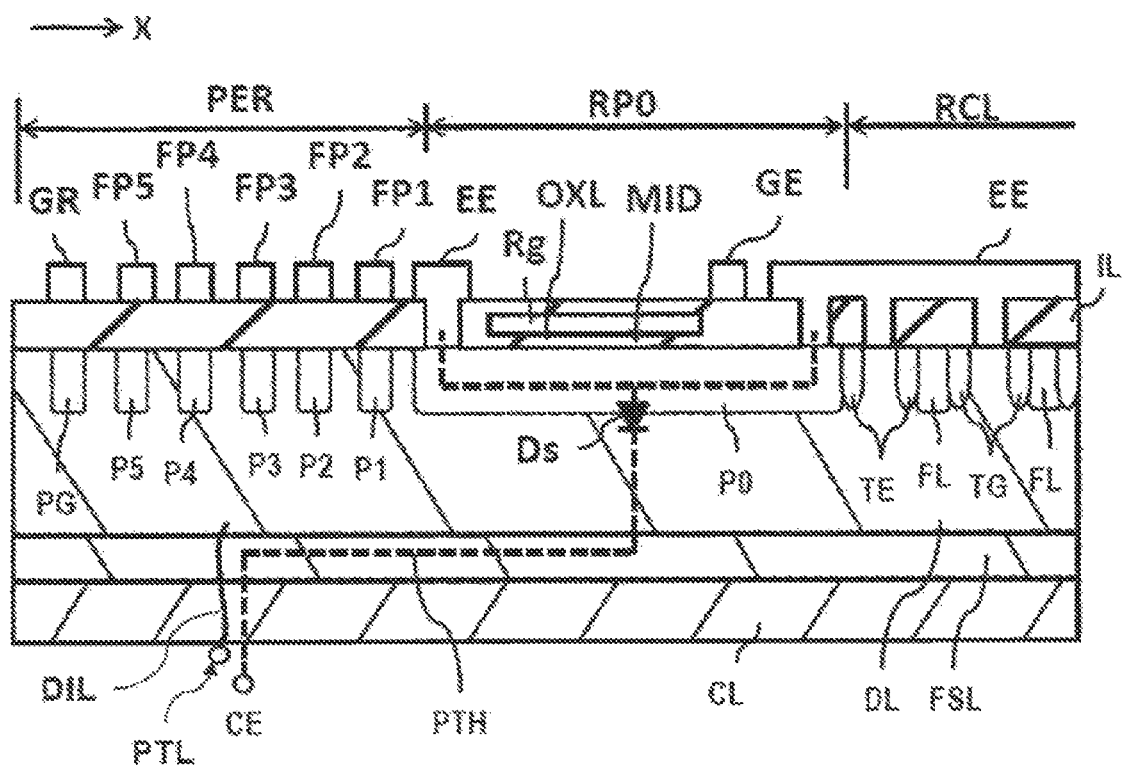
FIG. 32 is a cross-sectional view for explaining a parasitic diode configured in the IGBT.
Figure 33:
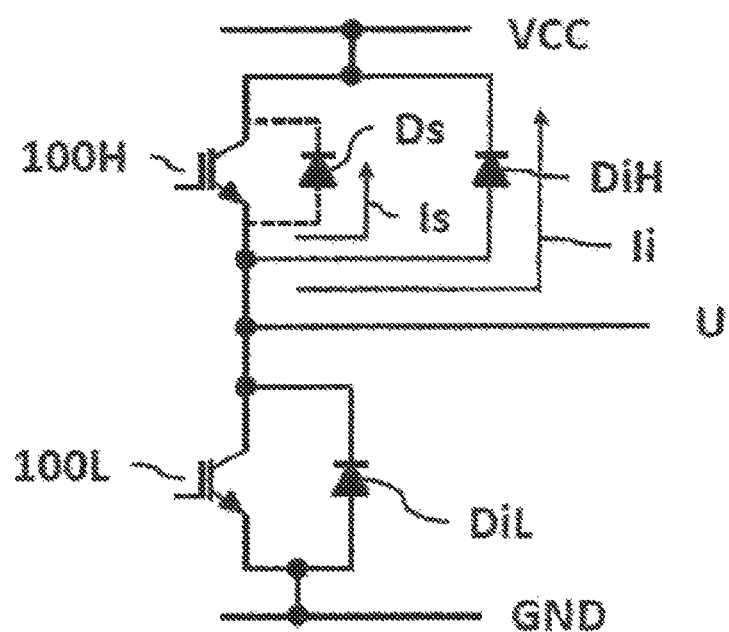
FIG. 33 is an equivalent circuit diagram for explaining the parasitic diode configured in an IGBT on a high side of FIG. 31.

FIG. 30 is a circuit block diagram showing one example of a motor driving circuit. FIG. 31 is a circuit diagram for explaining the operations of the IGBT and the diode corresponding to the U phase of FIG. 30. FIG. 32 is a cross-sectional view for explaining a parasitic diode in the IGBT. FIG. 33 is an equivalent circuit diagram for explaining a parasitic diode in the IGBT on the high side in FIG. 31.

As shown in FIG. 30, a motor driving circuit includes the load such as the motor MOT and an inverter INV. The motor MOT is a three-phase motor made of the U phase "U", the V phase "V" and the W phase "W". Therefore, the inverter INV also handles the three phases made of the U phase "U", the V phase "V" and the W phase "W". Such an inverter INV handling the three phases includes six pairs of the IGBT 100 and the freewheeling diode Di in total. In each phase of the three phases made of the U phase "U", the V phase "V" and the W phase "W", the IGBT 100 and the freewheeling diode Di are connected in reverse parallel between an input potential of the motor MOT (corresponding to an output terminal of the inverter INV) and a power supply wiring VCL supplying the power supply potential (VCC) to the inverter INV, in other words, on the high side. And, in each phase of the three phases made of the U phase "U", the V phase "V" and the W phase "W", the IGBT 100 and the freewheeling diode Di are connected in reverse parallel between the input potential of the motor MOT (corresponding to the output terminal of the inverter INV) and a ground wiring GNL supplying the ground potential (GND) to the inverter INV, in other words, on the low side. In this case, the reverse parallel means a connection configuration in which a collector of the IGBT 100 is connected to a cathode of the freewheeling diode Di while an emitter of the IGBT 100 is connected to an anode of the freewheeling diode Di.

For each freewheeling diode Di, an Sic-SBD (Silicon carbide-Schottky Barrier Diode) can be utilized. In recent years, a hybrid module made of the SiC-SBD and the Si-IGBT has been popular. The SiC-SBD has unipolar, and therefore, has short reverse recovery time "trr". Thus, a "Vce" surge of the IGBT tends to be steep, and the breakage of the IGBT due to the reverse bias leakage tends to occur. This is because "dV/dt" is steep to cause impact ionization in the IGBT 100H on the high side although described in detail later. Circumstances incapable of overlooking not only the "Ices" failure of the IGBT but also the back-surface dislocation defect that increases the reverse bias leakage have arisen.

The dead time (Dead time) is provided to the inverter INV in order to prevent the short circuit on the loads of the upper and lower IGBTs of each phase, and the upper and lower IGBTs are turned OFF during this Dead time period.

As shown in FIG. 31, in this Dead time period, an electric current "Ii" flows in not the upper IGBT 100H (on the high side) but the freewheeling diode DiH on the high side. In the attention to the upper IGBT 100H (on the high side), the reverse bias state in which a voltage of the emitter of the IGBT 100H is higher than that of the collector is caused since the freewheeling diode DiH operates. The reverse bias voltage (−VCE) is regularly about −2 to −3 V.

When the lower IGBT 100L (on the low side) is turned ON in the Dead time state, the collector voltage of the IGBT 100L (=the emitter voltage of the IGBT 100H) drops down to the operational voltage. In other words, the state of the IGBT 100H switches from the reverse bias state to a forward bias state. In this case, it is found that the IGBT 100H is broken in some cases by increase in the potential VCE between the collector and the emitter at "dV/dt: 10 to 40 kV/μs". Regularly, in the IGBT, the potential VCE between the collector and the emitter operates at about "dV/dt: 2 to 7 kV/μs".

In the IGBT 100, the region of the back surface BS of the substrate SUB includes the p-type collector layer CL, and therefore, there is no body diode such as a MOSFET. However, as shown in FIG. 32, it is found that a parasitic diode Ds operates at the time of the reverse bias if a PN junction made of the p-type collector layer CL and the n-type field stop layer FSL in the region of the back surface BS of the substrate SUB is leaked by the dislocation defect DIL starting from the particles PTL as the start point. This parasitic diode Ds is made of the PN junction between the n-type drift layer DL and the annular P-type region P0 below the formation region of the embedded resistor Rg. An anode of the parasitic diode Ds is connected to the emitter electrode EE connected to right and left of the P-type region P0. Since the n-type field stop layer FSL is higher in the concentration than the n-type drift layer DL, a cathode of the parasitic diode Ds is connected from the n-type drift layer DL below the P-type region P0 to the collector electrode CE through the n-type field stop layer FSL. In this manner, an electric-current path "PTH" including the parasitic diode Ds is formed between the emitter electrode EE and the collector electrode CE.

As shown in FIG. 33, the parasitic diode Ds is configured so as to be connected between the emitter and the collector of the IGBT 100H. In the attention to the IGBT 100H, since the electric current Ii flows in the freewheeling diode Di during the Dead time period, the emitter voltage of the IGBT 100H is higher than the collector voltage (the reverse bias state). If the PN junction on the back surface of the IGBT 100H has the leakage path, the parasitic diode Ds operates, and an electric current "Is" also flows in the parasitic diode Ds of the IGBT 100H.

In this state, when the IGBT 100L on the low side is turned ON, the collector voltage of the IGBT 100L on the low side, in other words, the emitter voltage of the IGBT 100H on the high side drops down to the operational voltage of the IGBT 100L. For example, the emitter voltage of the IGBT 100H drops from the inverter driving voltage (VCC) such as 800 V down to about 2 V. In this case, when the IGBT 100L on the low side is turned ON at the high dV/dt, the IGBT 100H on the high side is broken. A mechanism of the breakage of the IGBT 100H on the high side is as follows.

1. Since the region of the back surface has the leakage path, the parasitic diode Ds of the IGBT 100H on the high side operates at the dead time.
2. When the IGBT 100L on the low side is turned ON, the collector-emitter potential Vice is applied to the IGBT 100H on the high side. In other words, the state of the collector-emitter potential Vice of the IGBT 100H on the high side is switched from the reverse bias state to the forward bias state (the gate voltage of the IGBT 100H on the high side remains OFF).
3. At the time of the reverse bias, a lot of carriers are caused in the bulk by the operation of the parasitic diode Ds.
4. In this state, by the increase in the collector-emitter potential Vce of the IGBT 100H on the high side at the high dV/dt, the impact ionization is easily caused at the PN junction of the parasitic diode Ds.
5. A lot of hole carriers caused by this impact ionization flow to the emitter electrode EE through the P-type region P0 below the embedded resistor Rg and the emitter contact.
6. At this time, since the voltage drop occurs in the P-type region P0, the high electric field is formed in the oxidation film OXL between the P-type region P0 and the embedded resistor Rg, and the dielectric breakdown occurs in the oxidation film OXL.

A portion where the dielectric breakdown of the oxidation film OXL occurs is around a center portion "MID" in the middle of the contact of the emitter electrode EE connected to the right and the left of the P-type region P0. In FIG. 32, note that a width of the cell peripheral junction region RP in the first direction X, in other words, a width of the P-type region P0 in the first direction X is, for example, about 1 to 3 mm, and a width of the outer circumferential portion PER in the first direction X is, for example, about 400 to 600 μm. In other words, the width of the P-type region P0 in the first direction X is relatively large, and the contact of the emitter electrode EE is wide, and therefore, the voltage drop due to the P-type region P0 is relatively large. Therefore, the high electric field is formed.

Therefore, as explained in the third modification example (FIG. 22) and the fourth modification example (FIG. 24), the electric-current leakage at the time of reverse bias can be suppressed by the formation of the dislocation suppressing layer DSL1b or the dislocation suppressing layers DSL1b and DSL2b. As explained in the fourth modification example, the electric-current leakage between the emitter and the collector and the electric-current leakage at the time of reverse bias can be suppressed by the formation of the dislocation suppressing layers DSL1b and DSL2b. The third modification example and the fourth modification example can provide the IGBT capable of handling the high-speed switching while suppressing the electric-current leakage at the time of reverse bias.

The IGBT 100 including the dislocation suppressing layer as disclosed in the present application is better to be utilized as each IGBT of the motor driving circuit shown in FIG. 30, and the hybrid module including the inverter made of the SiC-SBD is better to be configured as each freewheeling diode Di of the same. This configuration can provide the motor driving circuit capable of handling the high-speed switching while preventing the breakage due to the electric-current leakage at the time of reverse bias in the IGBT.

In the foregoing, the present invention made by the present inventors has been concretely described on the basis of the embodiments. However, the present invention is not limited to the foregoing embodiments, and various modifications can be made within the scope of the present invention.

For example, the semiconductor substrate SUB may be a substrate including an N-type epitaxial layer of a low impurity concentration formed on an N-type semiconductor substrate of a high impurity concentration.

What is claimed is:
1. A semiconductor device comprising:
a silicon substrate including a first main surface and a second main surface facing the first main surface;
a p-type base layer formed on the first main surface;
an n-type emitter layer formed in the p-type base layer;
a p-type collector layer formed on the second main surface; and a dislocation suppressing layer formed in the p-type collector layer and forming a hetero junction with the silicon substrate.

2. The semiconductor device according to claim 1 further comprising:
a stripe-patterned trench gate formed on the first main surface so that the stripe patterns face one another;
an n-type hole barrier layer formed on the first main surface so as to be below the p-type base layer;
a stripe-patterned trench emitter formed on the first main surface so as to be arranged with a predetermined distance from the stripe-patterned trench gate and so that the stripe patterns face one another;
a p-type floating layer arranged between the trench gate and the trench emitter and having one end in contact with a side surface of the trench gate and the other end in contact with a side surface of the trench emitter;
an n-type field stop layer formed on the second main surface so as to be inside the p-type collector layer; and
an n-type drift layer arranged between the n-type field stop layer and the n-type hole barrier layer,
wherein the p-type base layer is formed in a region surrounded by the stripe-patterned trench gate.

3. The semiconductor device according to claim 1,
wherein the dislocation suppressing layer includes a silicon germanium layer.

4. The semiconductor device according to claim 3,
wherein the silicon germanium layer is formed on the entire silicon substrate in a planar view.

5. The semiconductor device according to claim 3,
wherein the silicon germanium layer is selectively formed on the silicon substrate in a planar view.

6. The semiconductor device according to claim 5,
wherein the silicon germanium layer has a stripe pattern in a planar view.

7. The semiconductor device according to claim 3,
wherein the silicon germanium layer includes an upper surface in a region of the first main surface and a lower sur face in a region of the second main surface, and
each of the upper surface and the lower surface has the hetero junction.

8. The semiconductor device according to claim 3,
wherein the silicon germanium layer includes an upper surface in a region of the first main surface and a lower surface in a region of the second main surface, and
the upper surface has the hetero junction while the lower surface does not have the hetero junction.

9. The semiconductor device according to claim 1,
wherein the dislocation suppressing layer includes a first dislocation suppressing layer and a second dislocation suppressing layer,
the first dislocation suppressing layer is closer to the first main surface than the second dislocation suppressing layer in a cross-sectional view, and
the second dislocation suppressing layer is formed in a region where than first dislocation suppressing layer is not formed in a planar view.

10. The semiconductor device according to claim 1,
wherein the silicon substrate includes a cell formation region and a peripheral region surrounding the cell formation region in a planar view,
the dislocation suppressing layer is formed below the peripheral region in a planar view.

11. The semiconductor device according to claim 10,
wherein the dislocation suppressing layer includes a lattice spacing strain layer containing any one of carbon, silicon, argon, fluorine and nitrogen.

12. The semiconductor device according to claim 10,
wherein the dislocation suppressing layer includes a first dislocation suppressing layer and a second dislocation suppressing layer,
the first dislocation suppressing layer is closer to the first main surface than the second dislocation suppressing layer in a cross-sectional view,
the first dislocation suppressing layer is arranged below the peripheral region in a planar view, and
the second dislocation suppressing layer is arranged below the cell formation region in a planar view.

13. The semiconductor device according to claim 12,
wherein each of the first dislocation suppressing layer and the second dislocation suppressing layer includes a silicon germanium layer.

14. The semiconductor device according to claim 12,
wherein the first dislocation suppressing layer includes a lattice spacing strain layer containing any one of carbon, silicon, argon, fluorine and nitrogen, and
the second dislocation suppressing layer includes a silicon germanium layer.

15. A method of manufacturing a semiconductor device comprising:
a step of preparing a silicon substrate including an n-type emitter layer, a p-type base layer, a trench gate, a trench emitter, a p-type floating layer, an n-type hole barrier layer, a gate electrode and an emitter electrode that are formed in a region of its first main surface;
a first step of forming a p-type collector layer on a second main surface facing the first main surface of the silicon substrate;
a second step of forming a first dislocation suppressing layer inside the p-type collector layer, the first dislocation suppressing layer forming a hetero junction with the silicon substrate;
a third step of forming an n-type field stop layer on the p-type collector layer in the region of the first main surface; and
a fourth step of forming a collector electrode connected to the p-type collector layer.

16. The method of manufacturing the semiconductor device according to claim 15,
wherein the first step and the second step includes:
a step of forming a first implantation layer for forming a P-type impurity implantation layer by an ion implantation method of doping with a P-type impurity to the second main surface of the silicon substrate;
a step of forming a second implantation layer for forming a first germanium implantation layer by an ion implantation method of doping with germanium to the second main surface of the silicon substrate; and then,
an annealing step of forming the p-type collector layer and the first dislocation suppressing layer by annealing to the second main surface of the silicon substrate to activate the P-type impurity implantation layer and the first germanium implantation layer.

17. The method of manufacturing the semiconductor device according to claim 16,
wherein the first dislocation suppressing layer is formed on the entire silicon substrate in a planar view,
the first dislocation suppressing layer includes an upper surface in the region of the first main surface and a lower surface in the region of the second main surface, and each of the upper surface and the lower surface has the hetero junction, or the upper surface has the hetero junction while the lower surface does not have the hetero junction.

18. The method of manufacturing the semiconductor device according to claim 17,
wherein the silicon substrate in a planar view includes: a cell formation region including the n-type emitter layer, the p-type base layer, the trench gate, the trench emitter, the p-type floating layer and the n-type hole barrier layer; and a peripheral region surrounding the cell formation region,
the first dislocation suppressing layer is formed below the peripheral region in a planar view,
the first dislocation suppressing layer includes the upper surface in the region of the first main surface and the lower surface in the region of the second main surface, and
each of the upper surface and the lower surface has the hetero junction.

19. The method of manufacturing the semiconductor device according to claim 16 further comprising:
a step of forming a third implantation layer for forming a second germanium implantation layer in a portion closer to the second main surface than the first germanium implantation layer by an ion implantation method of doping with germanium to the second main surface of the silicon substrate,
wherein, in the step of forming the second implantation layer, the first germanium implantation layer, the number of which is one or plural, is formed,
in the step of forming the third implantation layer, the second germanium implantation layer, the number of which is one or plural, is formed in a region where the first germanium implantation layer, the number of which is one or plural, is not formed in a planar view, and
the second dislocation suppressing layer, the number of which is one or plural, is formed by the annealing step activating the second germanium implantation layer, the number of which is one or plural.

20. The method of manufacturing the semiconductor device according to claim 19,
wherein the plurality of first dislocation suppressing layers are arranged to form a stripe pattern in a planar view, and
the plurality of second dislocation suppressing layers are arranged to form a stripe pattern in a planar view.

\* \* \* \* \*